(12) United States Patent
Hu et al.

(10) Patent No.: US 10,826,479 B2
(45) Date of Patent: Nov. 3, 2020

(54) WAVEFORM CONVERSION CIRCUIT FOR GATE DRIVER

(71) Applicant: Delta Electronics, Inc., Taoyuan (TW)

(72) Inventors: Chih-I Hu, Taoyuan (TW); Po-Chin Chuang, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 0 days.

(21) Appl. No.: 16/151,829

(22) Filed: Oct. 4, 2018

(65) Prior Publication Data

US 2019/0036519 A1 Jan. 31, 2019

Related U.S. Application Data

(63) Continuation-in-part of application No. 15/203,468, filed on Jul. 6, 2016, now Pat. No. 10,348,286.

(Continued)

(51) Int. Cl.
*H03K 17/687* (2006.01)
*H03K 17/0412* (2006.01)
(Continued)

(52) U.S. Cl.
CPC ........... *H03K 17/0412* (2013.01); *H03K 5/08* (2013.01); *H03K 17/063* (2013.01); *H03K 17/162* (2013.01); *H03K 2017/066* (2013.01)

(58) Field of Classification Search
CPC ............... H03K 17/04; H03K 17/0412; H03K 17/04123; H03K 17/04126; H03K 17/08; H03K 17/081; H03K 17/0812; H03K 17/08122; H03K 17/08126; H03K 17/16; H03K 17/161; H03K 17/162
(Continued)

(56) References Cited

U.S. PATENT DOCUMENTS

| | | | | |
|---|---|---|---|---|
| 4,947,055 | A | * | 8/1990 | Shekhawat ...... H03K 17/04126 327/109 |
| 7,990,202 | B2 | * | 8/2011 | Fang ....................... H02M 1/08 327/108 |

(Continued)

FOREIGN PATENT DOCUMENTS

JP         S55134539 A         10/1980

OTHER PUBLICATIONS

Office Action dated Feb. 9, 2018 in TW Application No. 106115954 (18 pages).

(Continued)

*Primary Examiner* — Tom Skibinski
(74) *Attorney, Agent, or Firm* — Muncy, Geissler, Olds & Lowe, P.C.

(57) ABSTRACT

A waveform conversion circuit for converting a control signal of a control node ranging from a high voltage level to a low voltage level of a reference node into a driving signal of a first node is provided. The waveform conversion circuit includes a first resistor, a first capacitor, a unidirectional conducting device, and a voltage clamp unit. The first resistor and the first capacitor are in parallel and coupled between the control node and the first node. The unidirectional conducting device unidirectionally discharges the first node to the control node. The voltage clamp unit is coupled between the first node and the reference node and configured to clamp a driving signal.

25 Claims, 19 Drawing Sheets

Related U.S. Application Data

(60) Provisional application No. 62/613,870, filed on Jan. 5, 2018.

(51) Int. Cl.
  *H03K 5/08* (2006.01)
  *H03K 17/06* (2006.01)
  *H03K 17/16* (2006.01)

(58) Field of Classification Search
  USPC ........ 327/108–112, 427, 434, 437, 379–391, 327/180, 307, 309, 310, 312–314; 326/82, 83, 87
  See application file for complete search history.

(56) References Cited

U.S. PATENT DOCUMENTS

| | | | |
|---|---|---|---|
| 2008/0030229 A1 | 2/2008 | Walker | |
| 2009/0066404 A1* | 3/2009 | Heppenstall | G01K 7/01 327/513 |
| 2011/0080192 A1* | 4/2011 | Ogawa | H03K 17/04123 327/109 |
| 2011/0285447 A1* | 11/2011 | Nakanishi | H03K 5/08 327/326 |
| 2012/0306545 A1* | 12/2012 | Machida | H02M 1/08 327/109 |

OTHER PUBLICATIONS

Office Action with Search Report based on corresponding TW application No. 107145105 dated Oct. 21, 2019.

* cited by examiner

WAVEFORM CONVERSION CIRCUIT FOR GATE DRIVER

CROSS REFERENCE TO RELATED APPLICATIONS

This application is a Continuation-In-Part of pending U.S. patent application Ser. No. 15/203,468, filed on Jul. 6, 2016 and entitled "waveform conversion circuit for gate driver", the entirety of which is incorporated by reference herein.

This application claims the benefit of U.S. Provisional Application No. 62/613,870, filed on Jan. 5, 2018, the entirety of which is incorporated by reference herein.

BACKGROUND OF THE INVENTION

Field of the Invention

The disclosure relates generally to a gate driver for driving the gate of a switching element.

Description of the Related Art

A GaN device has great potential compared to existing Si devices, and therefore, is anticipated for practical use. A standard GaN FET is a normally-on device, and therefore, needs a negative power source. On the other hand, a normally-off GaN FET is very difficult to produce. A normally-off GaN FET has a threshold voltage of about +1 V, which is very low compared to that of an existing Si MOSFET. This is the first problem with the normally-off GaN FET.

In addition, a normally-off GaN FET can break easily if a high voltage is applied to its gate, meaning that a normally-off GaN FET cannot be used in a normal driving IC. This is the second problem with the normally-off GaN FET. Due to these two problems, a gate driver for the Si MOSFET (IGBT, or Insulated Gate Bipolar Transistor) is not applicable, as it would be for a normally-off GaN FET. In other words, the normally-off GaN FET needs an exclusive gate driver.

In connection with the first problem, the turn-off time of the normally-off GaN FET will be shortened if a voltage that is sufficiently lower than the threshold voltage of about +1 V, and preferably a negative voltage lower than 0 V, is applied to the gate of the normally-off GaN FET. For this, the normally-off GaN FET needs a negative power source. A negative power source is undesirable, however, although it is necessary for realizing a normally-off state.

In connection with the second problem, the turn-on time of the normally-off GaN FET can be shortened if a voltage that is sufficiently higher than the threshold voltage is applied to the gate of the normally-off GaN FET. More precisely, shortening the turn-on time requires an instantaneous large current, and creating such a large current is properly achievable with a higher voltage. It is, however, unable to apply a high voltage such as 10V used for the Si MOSFET to the gate of the normally-off GaN FET because this breaks the normally-off GaN FET.

In addition, the gate of the normally-off GaN FET may experience interference from noise from the drain when the normally-off GaN FET is OFF, and as a result the normally-off GaN FET may be turned ON incorrectly. Therefore, an efficient waveform conversion circuit is urgently needed, and this waveform conversion can be adopted for use with any type of transistor.

BRIEF SUMMARY OF THE INVENTION

In an embodiment, a waveform conversion circuit for converting a control signal of a control node ranging from a high voltage level to a low voltage level of a reference node into a driving signal of a first node is provided. The waveform conversion circuit comprises: a first resistor, a first capacitor, a unidirectional conducting device, and a voltage clamp unit. The first resistor is coupled between the control node and the first node. The first capacitor is coupled between the control node and the first node. The unidirectional conducting device unidirectionally discharges the first node to the control node. The voltage clamp unit is coupled between the first node and the reference node. The voltage clamp unit is configured to clamp the driving signal.

According to an embodiment of the invention, the waveform conversion circuit further comprises a second resistor. The second resistor is coupled between the control node and the first capacitor.

According to another embodiment of the invention, the waveform conversion circuit further comprises a third resistor. The third resistor is coupled between the unidirectional conducting device and the control node.

According to an embodiment of the invention, a first voltage is converted from the low voltage level of the control signal and a second voltage is converted from the high voltage level of the control signal, wherein the driving voltage ranges from the second voltage to the first voltage.

According to an embodiment of the invention, the second voltage is not greater than the high voltage level.

According to an embodiment of the invention, the unidirectional conducting device comprises a limit diode. The limit diode comprises an anode and a cathode. The anode is coupled to the first node, and the cathode is coupled to the control node. The first voltage is clamped by a limit forward voltage of the limit diode.

According to an embodiment of the invention, the voltage clamp unit comprises a zener diode. The zener diode comprises an anode and a cathode. The anode is coupled to the reference node, and the cathode is coupled to the first node. The first voltage is determined by a forward voltage of the zener diode, and the second voltage is determined by a reverse breakdown voltage of the zener diode.

According to another embodiment of the invention, the voltage clamp unit comprises a zener diode. The zener diode comprises an anode and a cathode. The anode is coupled to the first node, and the cathode is coupled to the reference node. The first voltage is determined by a reverse breakdown voltage of the zener diode, and the second voltage is determined by a forward voltage of the zener diode.

According to another embodiment of the invention, the voltage clamp unit comprises: a diode. The diode comprises an anode and a cathode. The anode is coupled to the first node, and the cathode is coupled to the reference node. The second voltage is determined by a forward voltage of the diode.

According to another embodiment of the invention, the voltage clamp unit comprises a first zener diode and a second zener diode. The first zener diode comprises a first anode and a first cathode. The first cathode is coupled to the first node. The second zener diode comprises a second anode and a second cathode. The second anode is coupled to the first anode, and the second cathode is coupled to the reference node. The first voltage is determined by a sum of a reverse breakdown voltage of the second zener diode and a forward voltage of the first zener diode. The second voltage is determined by the sum of the reverse breakdown voltage of the first zener diode and the forward voltage of the second zener diode.

According to another embodiment of the invention, the voltage clamp unit comprises a first diode and a second diode. The first diode comprises a first anode and a first cathode. The first cathode is coupled to the first node and the first anode is coupled to the reference node. The second diode comprises a second anode and a second cathode. The second anode is coupled to the first node, and the second cathode is coupled to the reference node. The first voltage is determined by a forward voltage of the first diode and the second voltage is determined by a forward voltage of the second diode.

According to another embodiment of the invention, the voltage clamp unit comprises a first diode and a zener diode. The first diode comprises a first anode and a first cathode. The first anode is coupled to the first node. The zener diode comprises a zener anode and a zener cathode. The zener anode is coupled to the reference node, and the zener cathode is coupled to the first cathode. The first voltage is determined by the low voltage level minus the capacitor voltage stored in the first capacitor. The capacitor voltage is equal to the high voltage level minus a sum of a reverse breakdown voltage of the zener diode and a forward voltage of the first diode. The second voltage is determined by the sum of the reverse breakdown voltage of the zener node and the forward voltage of the diode.

According to another embodiment of the invention, the voltage clamp unit comprises a zener diode and a first diode. The zener diode comprises a zener anode and a zener cathode, wherein the zener anode is coupled to the first node. The first diode comprises a first anode and a first cathode, wherein the first anode is coupled to the reference node, and the first cathode is coupled to the zener cathode. The first voltage is determined by a sum of a reverse breakdown voltage of the zener diode and a forward voltage of the first diode. The second voltage is equal to the high voltage level.

In another embodiment, a gate-driving circuit for turning a switch device on and off by applying a driving signal to a gate terminal of the switch device is provided. The switch device has the gate terminal, a drain terminal, and a source terminal coupled to a reference node. The gate-driving circuit comprises: a controller and a waveform conversion circuit. The controller is supplied by a high voltage level and a low voltage level to generate a control signal at a control node ranging from the high voltage level to the low voltage level of the reference node. The waveform conversion circuit converts the control signal into the driving signal and comprises: a first resistor, a first capacitor, a unidirectional conducting device, and a voltage clamp unit. The first resistor is coupled between the control node and the gate terminal of the switch device. The first capacitor is coupled between the control node and the gate terminal of the switch device. The unidirectional conducting device unidirectionally discharges the gate terminal of the switch device to the control node. The voltage clamp unit is coupled between the gate terminal and the source terminal of the switch device and configured to clamp the driving signal.

According to an embodiment of the invention, the waveform conversion circuit further comprises a second resistor. The second resistor is coupled between the control node and the first capacitor.

According to another embodiment of the invention, the waveform conversion circuit further comprises a third resistor. The third resistor is coupled between the unidirectional conducting device and the control node.

According to an embodiment of the invention, the control signal ranges from a high voltage level to a low voltage level, wherein the first voltage is converted from the low voltage level of the control signal, and the second voltage is converted from the high voltage level of the control signal.

According to an embodiment of the invention, the waveform conversion circuit converts the control signal into a driving signal ranging from the second voltage to the first voltage.

According to an embodiment of the invention, the second voltage is not greater than the high voltage level.

According to an embodiment of the invention, the unidirectional conducting device comprises a limit diode. The limit diode comprises an anode and a cathode. The anode is coupled to the gate terminal of the switch device, and the cathode is coupled to the control node. The first voltage is clamped by a limit forward voltage of the limit diode.

According to an embodiment of the invention, the voltage clamp unit comprises a zener diode. The zener diode comprises an anode and a cathode. The anode is coupled to the source terminal of the switch device, and the cathode is coupled to the gate terminal of the switch device. The first voltage is determined by a forward voltage of the zener diode, and the second voltage is determined by a reverse breakdown voltage of the zener diode.

According to another embodiment of the invention, the voltage clamp unit comprises a zener diode. The zener diode comprises an anode and a cathode. The anode is coupled to the gate terminal of the switch device, and the cathode is coupled to the source terminal of the switch device. The first voltage is determined by a reverse breakdown voltage of the zener diode, and the second voltage is determined by a forward voltage of the zener diode.

According to another embodiment of the invention, the voltage clamp unit comprises: a diode. The diode comprises an anode and a cathode. The anode is coupled to the gate terminal of the switch device, and the cathode is coupled to the source terminal of the switch device. The second voltage is determined by a forward voltage of the diode.

According to another embodiment of the invention, the voltage clamp unit comprises a first zener diode and a second zener diode. The first zener diode comprises a first anode and a first cathode. The first cathode is coupled to the gate terminal of the switch device. The second zener diode comprises a second anode and a second cathode. The second anode is coupled to the first anode, and the second cathode is coupled to the source terminal of the switch device. The first voltage is determined by a sum of a reverse breakdown voltage of the second zener diode and a forward voltage of the first zener diode. The second voltage is determined by a sum of a reverse breakdown voltage of the first zener diode and a forward voltage of the second zener diode.

According to another embodiment of the invention, the voltage clamp unit comprises a first diode and a second diode. The first diode comprises a first anode and a first cathode. The first cathode is coupled to the gate terminal of the switch device and the first anode is coupled to the source terminal of the switch device. The second diode comprises a second anode and a second cathode. The second anode is coupled to the gate terminal of the switch device, and the second cathode is coupled to the source terminal of the switch device. The first voltage is determined by a forward voltage of the first diode and the second voltage is determined by a forward voltage of the second diode.

According to another embodiment of the invention, the voltage clamp unit comprises a first diode and a zener diode. The first diode comprises a first anode and a first cathode. The first anode is coupled to the gate terminal of the switch device. The zener diode comprises a zener anode and a zener cathode. The zener anode is coupled to the source terminal of the switch device, and the zener cathode is coupled to the first cathode. The first voltage is determined by the low voltage level minus the capacitor voltage stored in the first capacitor. The capacitor voltage is equal to the high voltage level minus a sum of a reverse breakdown voltage of the zener diode and a forward voltage of the first diode. The second voltage is determined by the sum of the reverse breakdown voltage of the zener node and the forward voltage of the first diode.

According to another embodiment of the invention, the voltage clamp unit comprises a zener diode and a first diode. The zener diode comprises a zener anode and a zener cathode, wherein the zener anode is coupled to the gate terminal of the switch device. The first diode comprises a first anode and a first cathode, wherein the first anode is coupled to the source terminal of the switch device, and the first cathode is coupled to the zener cathode. The first voltage is determined by a sum of a reverse breakdown voltage of the zener diode and a forward voltage of the first diode. The second voltage is equal to the high voltage level.

According to an embodiment of the invention, the voltage clamp unit and the switch device are packaged together.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
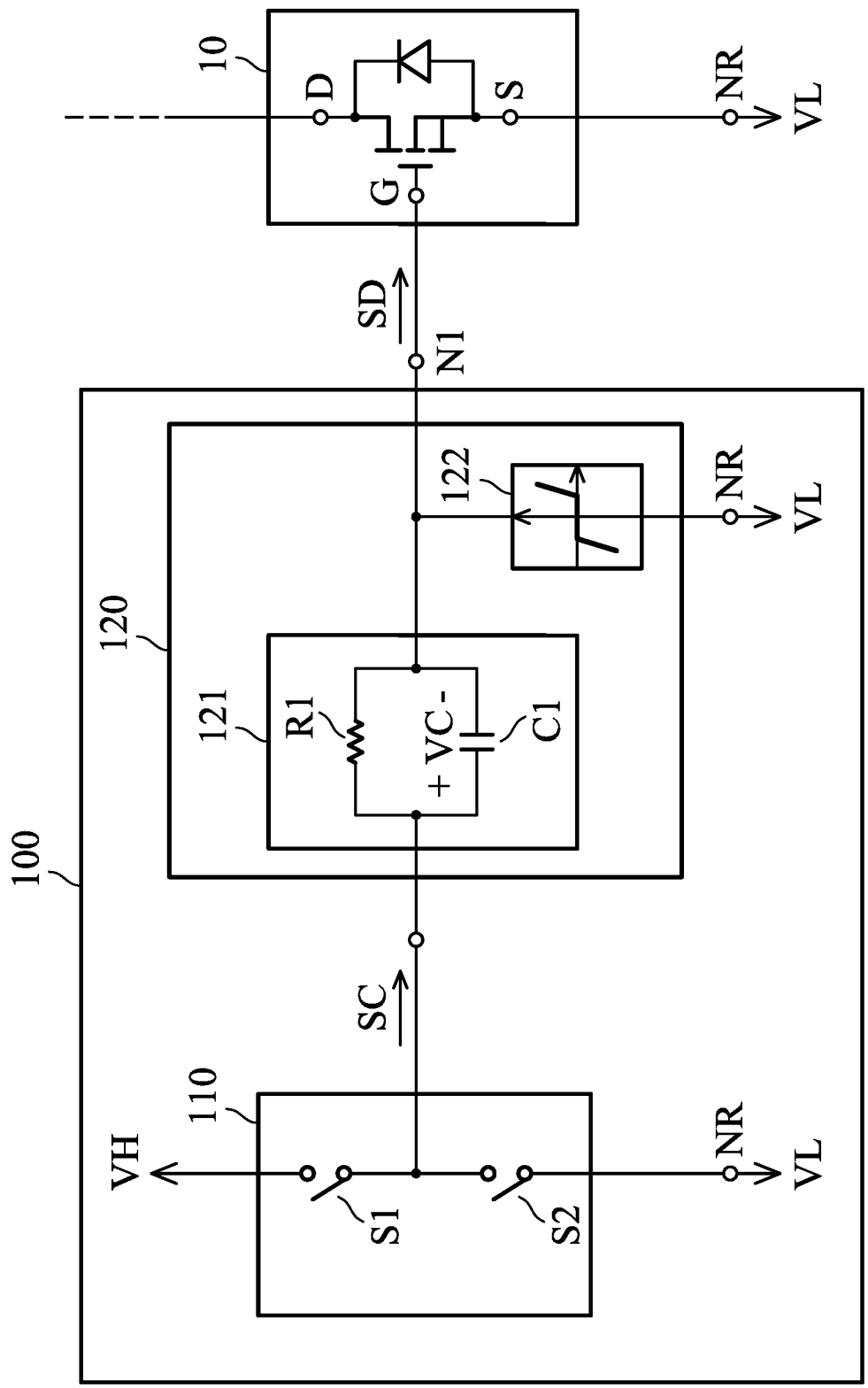
FIG. 1 is a block diagram of a gate driver in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 is a block diagram of a gate driver in accordance with an embodiment of the invention. As shown in FIG. 1, the gate driver 100 is configured to turn ON/OFF the switch device 10 which includes the gate terminal G, the source terminal S, and the drain terminal D. According to an embodiment of the invention, the switch device 10 is a normally-off transistor. According to another embodiment of the invention, the switch device is a normally-off GaN FET.

The gate driver 100 includes the controller 110 and the waveform conversion circuit 120. The controller 110, which is supplied by the high voltage level VH and the low voltage level VL, includes the first switch Si and the second switch S2. The first switch Si and the second switch S2 are alternately turned on and off, to generate ON/OFF pulses on the control signal SC. The controller 110 is simplified as the first switch Si and the second switch S2 for the simplicity of explanation.

The ON/OFF pulses of the control signal SC are applied through the parallel circuit 121 including the first resistor R1 and the first capacitor C1 to the gate terminal G of the switch device 10. Since the high voltage level VH exceeds the breakdown voltage of the switch device 10, the voltage clamp unit 122, which is coupled between the gate terminal G and the source of the switch device, is configured to clamp the voltage across the gate terminal G to the source when an ON pulse of the control signal SC is applied to the gate terminal G of the switch device 10. In other words, the voltage clamp unit 122 is configured to clamp the driving signal SD of the first node N1 under the breakdown voltage of the switch device 10 when an ON pulse of the control signal SC is applied to the gate terminal G of the switch device 10, since the voltage clamp unit 122 and the source of the switch device 10 are both coupled to the reference node NR of the low voltage level VL. According to an embodiment of the invention, as shown in FIG. 1, the first node N1 is coupled to the gate terminal G of the switch device 10.

When an OFF pulse of the control signal SC is applied to the gate terminal G of the switch device 10 through the parallel circuit 121, the voltage clamp unit 122 is configured to clamp the capacitor voltage VC stored in the first capacitor C1. According to an embodiment of the invention, the low voltage level VL of the reference node NR is equal to the ground level and the driving signal SD of the first node N1 is equal to the minus capacitor voltage VC. According to an embodiment of the invention, a normally-off GaN FET needs a negative bias to be turned off. The first capacitor C1 integrated with the voltage clamp unit 122 could properly turn off the switch device 10 when the switch device 10 is a normally-off GaN FET.

Figure 2:
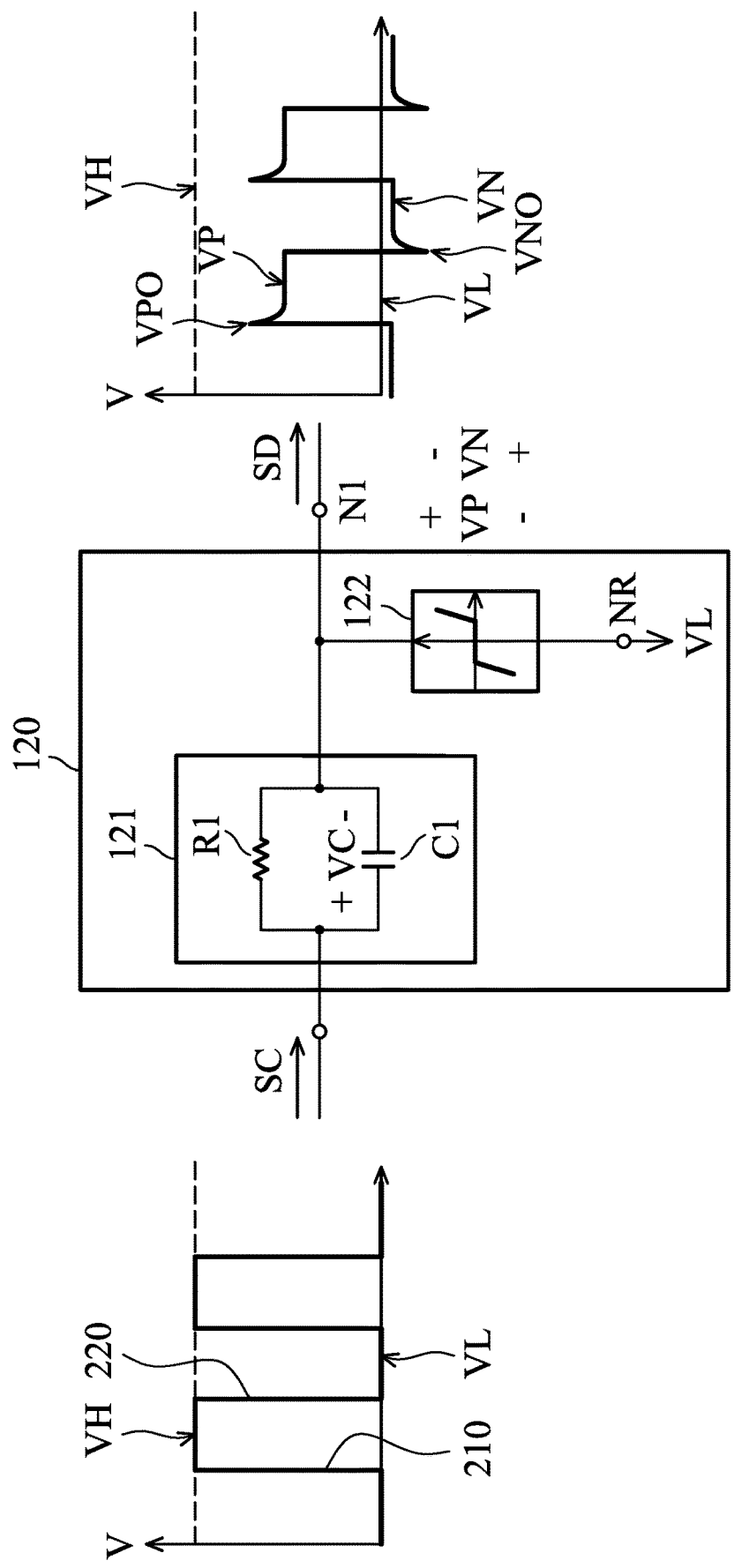
FIG. 2 illustrates the function of the waveform conversion circuit 120 in accordance with an embodiment of the invention.

FIG. 2 illustrates the function of the waveform conversion circuit 120 in accordance with an embodiment of the invention. As shown in FIG. 2, the control signal SC is illustrated as a square wave herein, which ranges from the high voltage level VH to the low voltage level VL of the reference node NR.

When the waveform conversion circuit 120 receives an ON pulse 210 of the control signal SC, the voltage clamp unit 122 clamps the driving signal SD of the first node N1 at the second voltage VP of the voltage clamp unit 122. The first resistor R1 is configured to clamp the current flowing from the control signal SC to the low voltage level VL of the reference node NR through the voltage clamp unit 122.

The overshoot voltage VPO can be determined by the first capacitor C1 and the parasitic resistance along the path from the control signal SC to the voltage clamp unit 122 through the first capacitor C1. According to an embodiment of the invention, the overshoot voltage VPO is as much as the high voltage level VH. According to an embodiment of the invention, the overshoot voltage VPO of the driving signal SD is configured to turn ON the switch device 10 in a faster speed, and the driving signal SD of the first node N1 is then clamped at the second voltage VP to keep the conduction loss of the switch device 10 reasonably low.

When the waveform conversion circuit 120 receives an OFF pulse 220 of the control signal SC, the low voltage level VL is applied to a terminal of the first capacitor C1. Since the capacitor voltage VC has been stored in the first capacitor C1 when the control signal SC is in the high voltage level VH, the driving signal SD of the first node N1 is a negative voltage when the low voltage level VL is applied to the first capacitor C1. In addition, the driving signal SD of the first node N1 is then clamped at the first voltage VN of the voltage clamp unit 122.

Likewise, the undershoot voltage VNO is also determined by the first capacitor C1 and the parasitic resistance along the path from the control signal SC to the voltage clamp unit 122 through the first capacitor C1. According to an embodiment of the invention, the undershoot voltage VNO of the driving signal SD of the first node N1 is configured to turn OFF the switch device 10 in a faster speed, and the driving signal SD of the first node N1 is then clamped at the first voltage VN to keep the leakage loss of the switch device 10 reasonably low. According to an embodiment of the invention, the first voltage VN, which is less than the low voltage level VL the reference node NR, is configured to prevent the switch device 10 to be turned ON by noise coupling.

According to an embodiment of the invention, the high voltage level VH is 12V, the low voltage level VL is 0V, the threshold voltage of the switch device 10 is 1V, and the range of the gate-to-source voltage of the switch device 10 is −5V~7V. Therefore, the second voltage VP is clamped around 6V to keep the turn-on resistance of the switch device 10 reasonably low, and the first voltage VN is clamped at −1 V to ensure that the switch device 10 is fully turned off.

Figure 3:
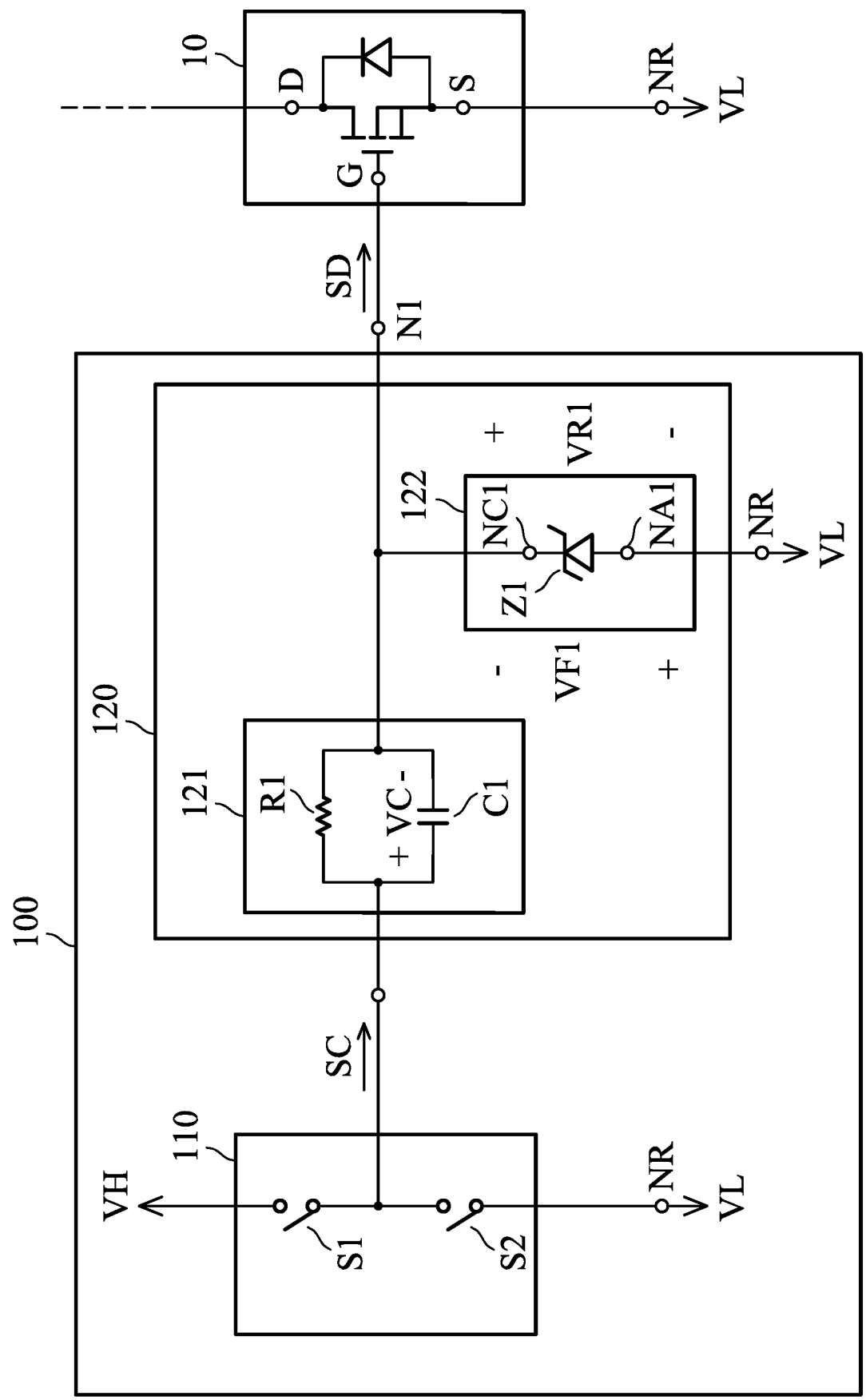
FIG. 3 is a block diagram of a gate driver in accordance with another embodiment of the invention.

FIG. 3 is a block diagram of a gate driver in accordance with another embodiment of the invention. As shown in FIG. 3, the voltage clamp unit 122 includes the first zener diode Z1. The first zener diode Z1 includes the first anode NA1 and the second cathode NC1. When a current flows through the first zener diode Z1 from the first anode NA1 to the first cathode NC1, the voltage across the first zener diode Z1 is defined as the first forward voltage VF1. According to an embodiment of the invention, when a current flows through the first zener diode Z1 from the first cathode NC1 to the first anode NA1, the voltage across the first zener diode Z1 is defined as the first reverse breakdown voltage VR1.

According to an embodiment of the invention, when the waveform conversion circuit 120 receives the control signal SC in the high voltage level VH, the driving signal SD of the first node N1 is eventually clamped at the first reverse breakdown voltage VR1 of the first zener diode Z1. According to another embodiment of the invention, when the waveform conversion circuit 120 receives the control signal SC in the low voltage level VL, the driving signal SD of the first node N1 is then clamped at the low voltage level VL minus the first forward voltage VF1 of the first zener diode Z1.

According to an embodiment of the invention, the first forward voltage VF1 is 0.7 V, the first reverse breakdown voltage VR1 is 6 V, the high voltage level VH is 12 V, and the low voltage level VL is 0 V. The driving signal SD is clamped at 6V when the control signal SC is 12 V, and the driving signal SD is equal to −0.7V when the control signal SC is 0 V. Therefore, when the switch device 10 is illustrated as a normally-off GaN FET, the turn-on resistance of the switch device 10 could be kept low due to the 6V driving signal SD, and the switch device 10 could be fully turned off due to the −0.7V driving signal SD.

Figure 4:
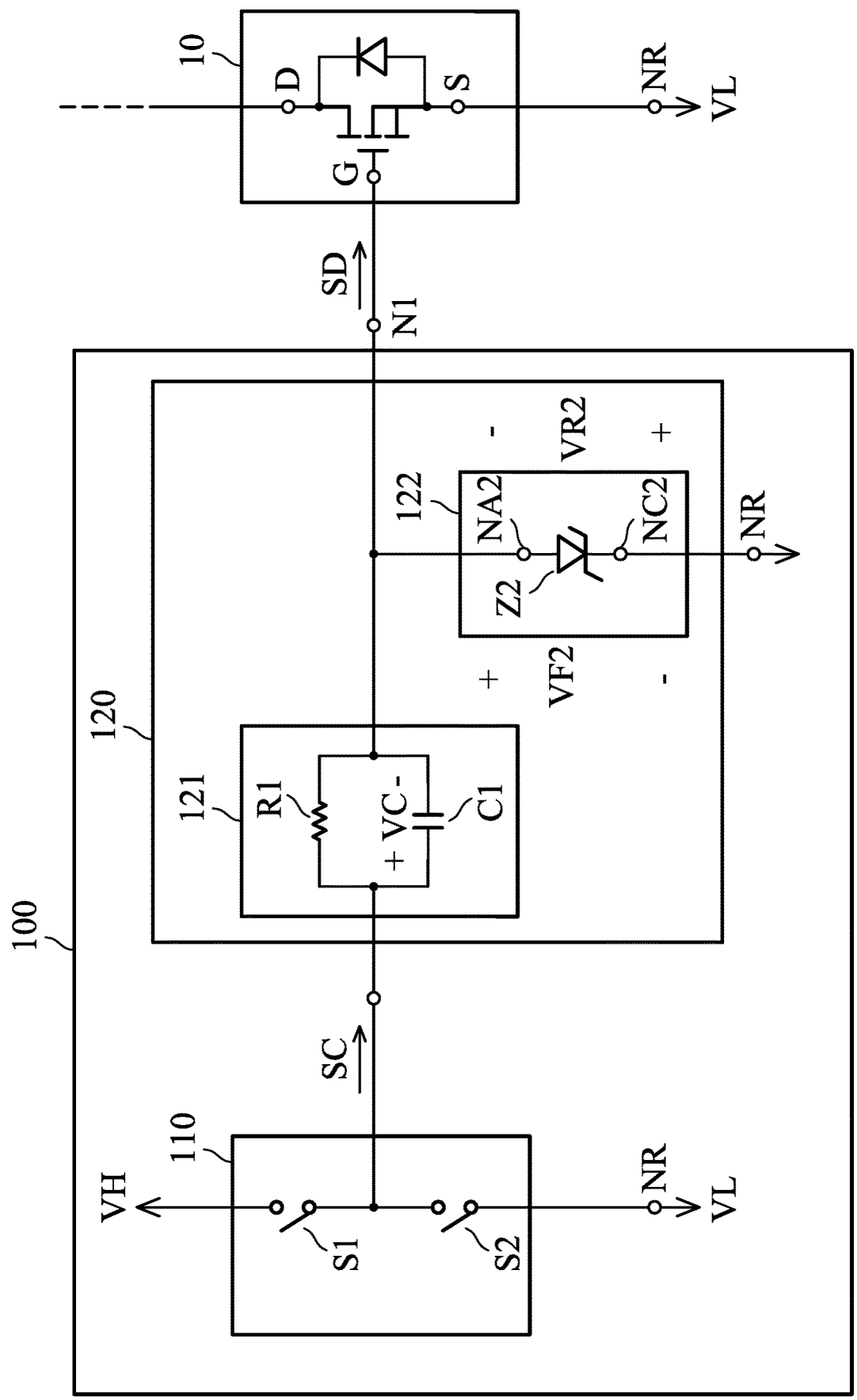
FIG. 4 is a block diagram of a gate driver in accordance with another embodiment of the invention.

FIG. 4 is a block diagram of a gate driver in accordance with another embodiment of the invention. Comparing the voltage clamp unit 122 in FIG. 4 with that in FIG. 3, the second anode NA2 of the second zener diode Z2 is coupled to the parallel circuit 121 and the low voltage level VL is applied to the second cathode NC2 of the second zener diode Z2. According to an embodiment of the invention, when the waveform conversion circuit 120 receives the control signal SC in the high voltage level VH, the driving signal SD is determined by the second forward voltage VF2 of the second zener diode Z2. According to another embodiment of the invention, when the waveform conversion circuit 120 receives the control signal SC in the low voltage level VL, the driving signal SD is then eventually clamped at the low voltage level VL minus the second reverse breakdown voltage VR2 of the second zener diode Z2.

Figure 5:
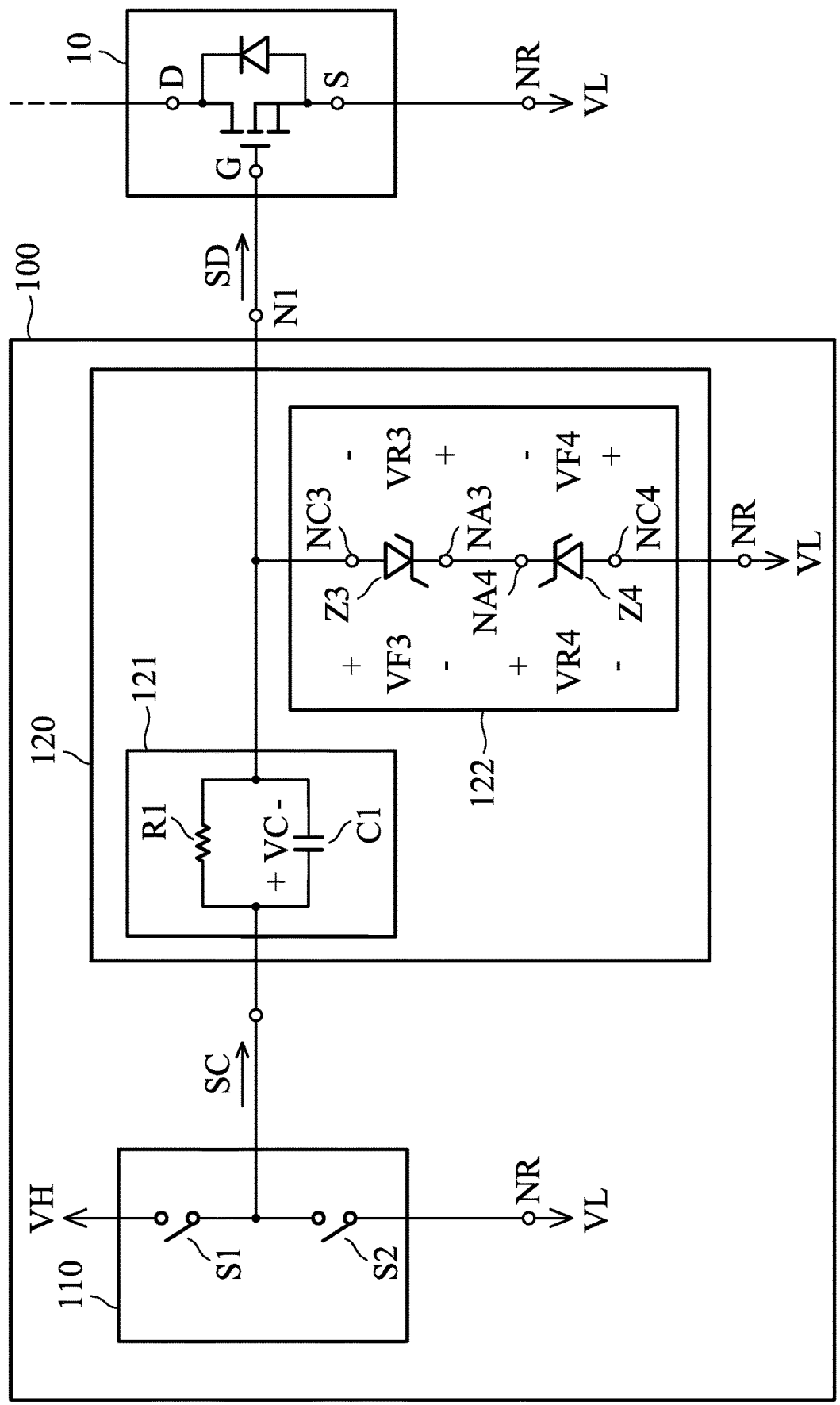
FIG. 5 is a block diagram of a gate driver in accordance with another embodiment of the invention.
Figure 6:
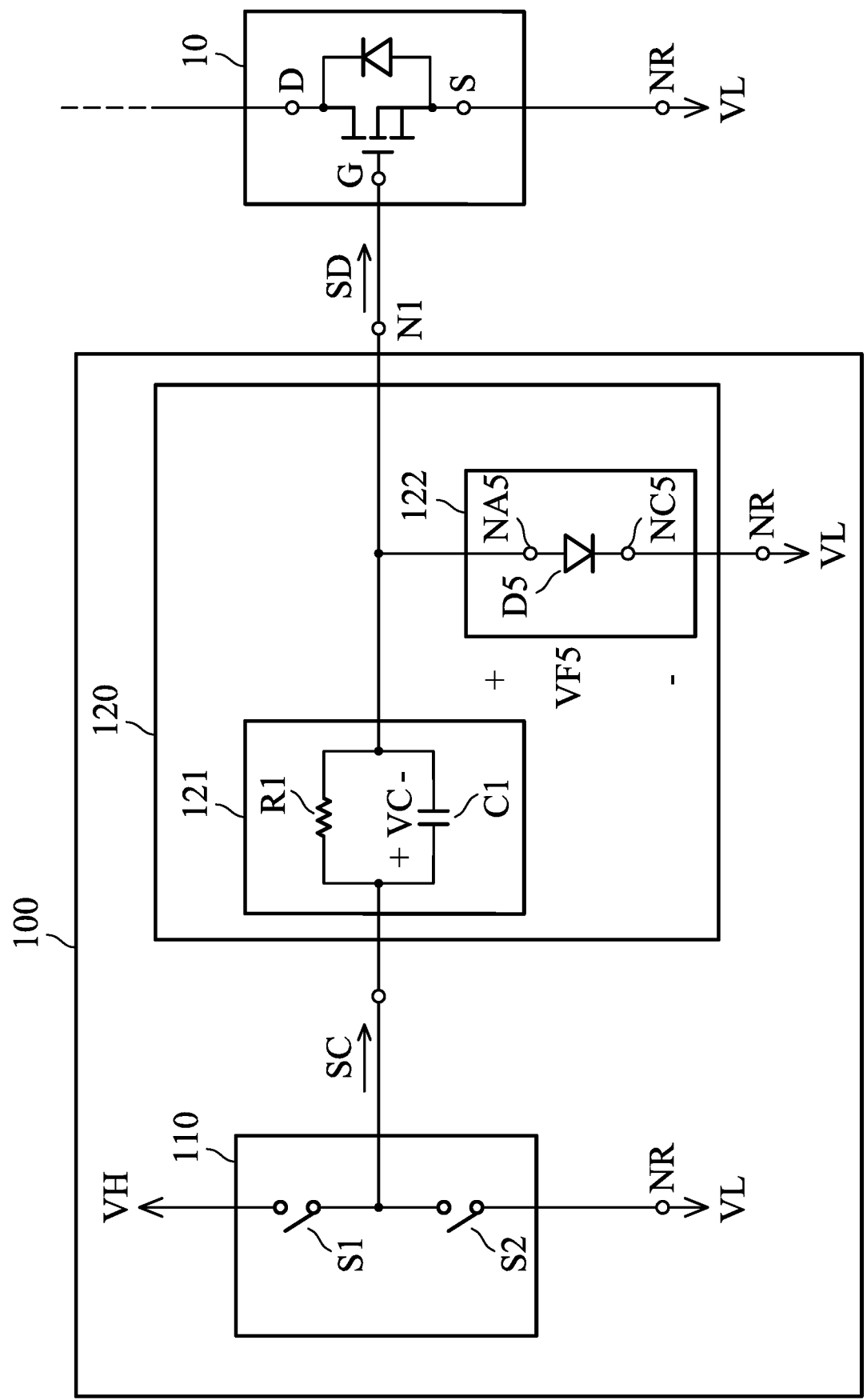
FIG. 6 is a block diagram of a gate driver in accordance with another embodiment of the invention.

FIG. 5 is a block diagram of a gate driver in accordance with another embodiment of the invention. As shown in FIG. 5, the voltage clamp unit 122 includes the third zener diode Z3 and the fourth zener diode Z4. The third anode NA3 of the third zener diode Z3 is coupled to the fourth anode NA4 of the fourth zener diode Z4. The third cathode NC3 is coupled to the gate terminal G of the switch device 10, and the fourth cathode NC4 is coupled to the source of the switch device 10.

According to an embodiment of the invention, when the waveform conversion circuit 120 receives the control signal SC in the high voltage level VH, the driving signal SD is clamped at the sum of the third forward voltage VF3 of the third zener diode Z3 and the fourth reverse breakdown voltage VR4 of the fourth zener diode Z4. According to another embodiment of the invention, when the waveform conversion circuit 120 receives the control signal SC in the low voltage level VL, the driving signal SD is then clamped at the low voltage level VL minus the sum of the third reverse breakdown voltage VR3 of the third zener diode Z3 and the fourth forward voltage VF4 of the fourth zener diode Z4.

FIG. 5 is a block diagram of a gate driver in accordance with yet another embodiment of the invention. As shown in FIG. 5, the voltage clamp unit 122 includes the third zener diode Z3 and the fourth zener diode Z4. The third anode NA3 of the third zener diode Z3 is coupled to the fourth anode NA4 of the fourth zener diode Z4. The third cathode NC3 is coupled to the gate terminal G of the switch device 10, and the fourth cathode NC4 is coupled to the source terminal S of the switch device 10.

According to another embodiment of the invention, when the waveform conversion circuit 120 receives the control signal SC in the low voltage level VL, the driving signal SD is equal to the capacitor voltage VC stored in the first capacitor C1, since the fifth diode D5 is open during reverse biasing. In addition, the capacitor voltage VC is equal to the high voltage level VH minus the fifth forward voltage VF5.

Figure 7:
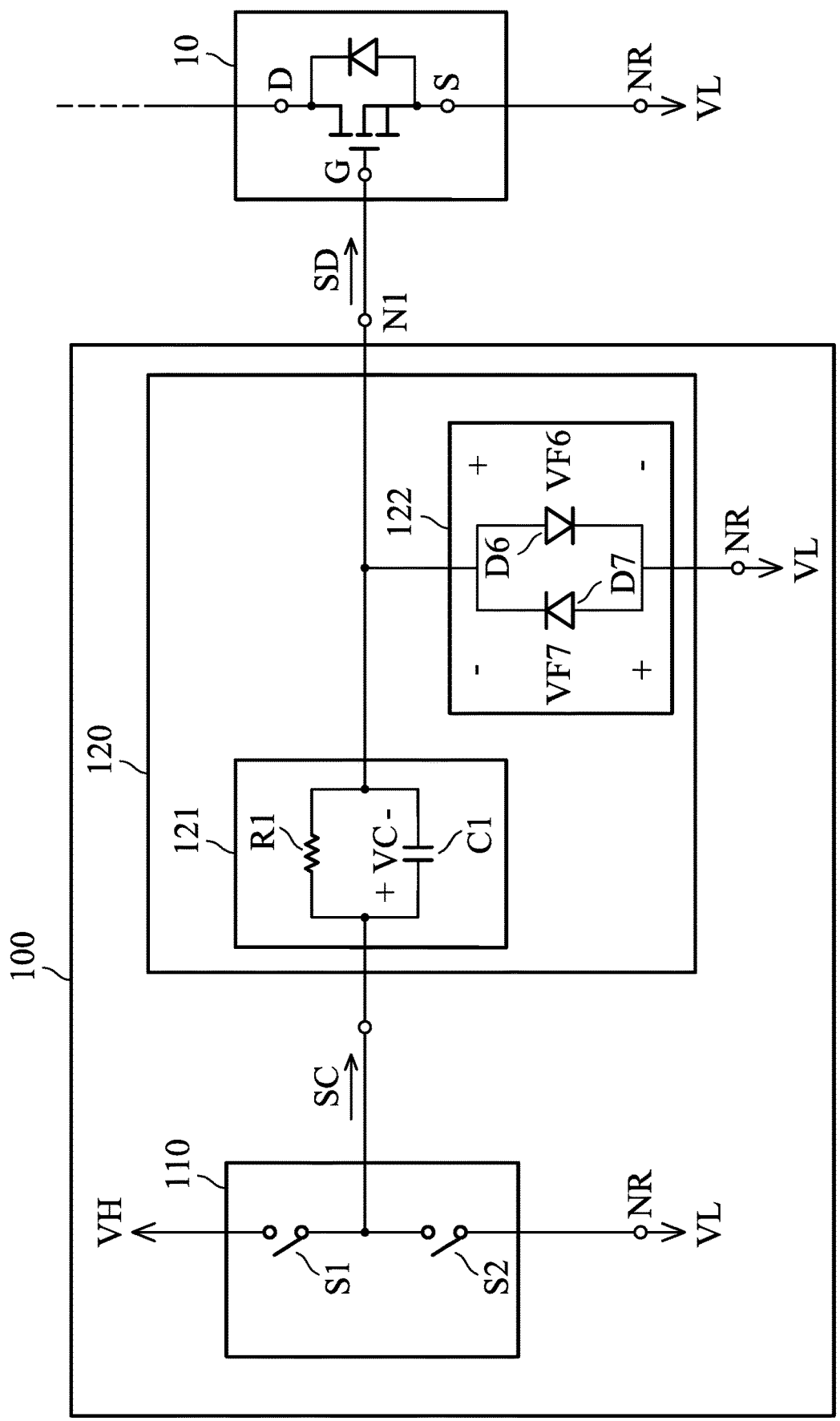
FIG. 7 is a block diagram of a gate driver in accordance with another embodiment of the invention.

FIG. 7 is a block diagram of a gate driver in accordance with another embodiment of the invention. As shown in FIG. 7, the voltage clamp unit 122 includes the sixth diode D6, which has the sixth forward voltage VF6, and the seventh diode D7, which has the seventh forward voltage VF7.

According to an embodiment of the invention, when the waveform conversion circuit 120 receives the control signal SC in the high voltage level VH, the driving signal SD is determined by the sixth forward voltage VF6 of the sixth diode Z6. According to another embodiment of the invention, when the waveform conversion circuit 120 receives the control signal SC in the low voltage level VL, the driving signal SD is clamped at the low voltage level VL minus the seventh forward voltage VF7.

Figure 8:
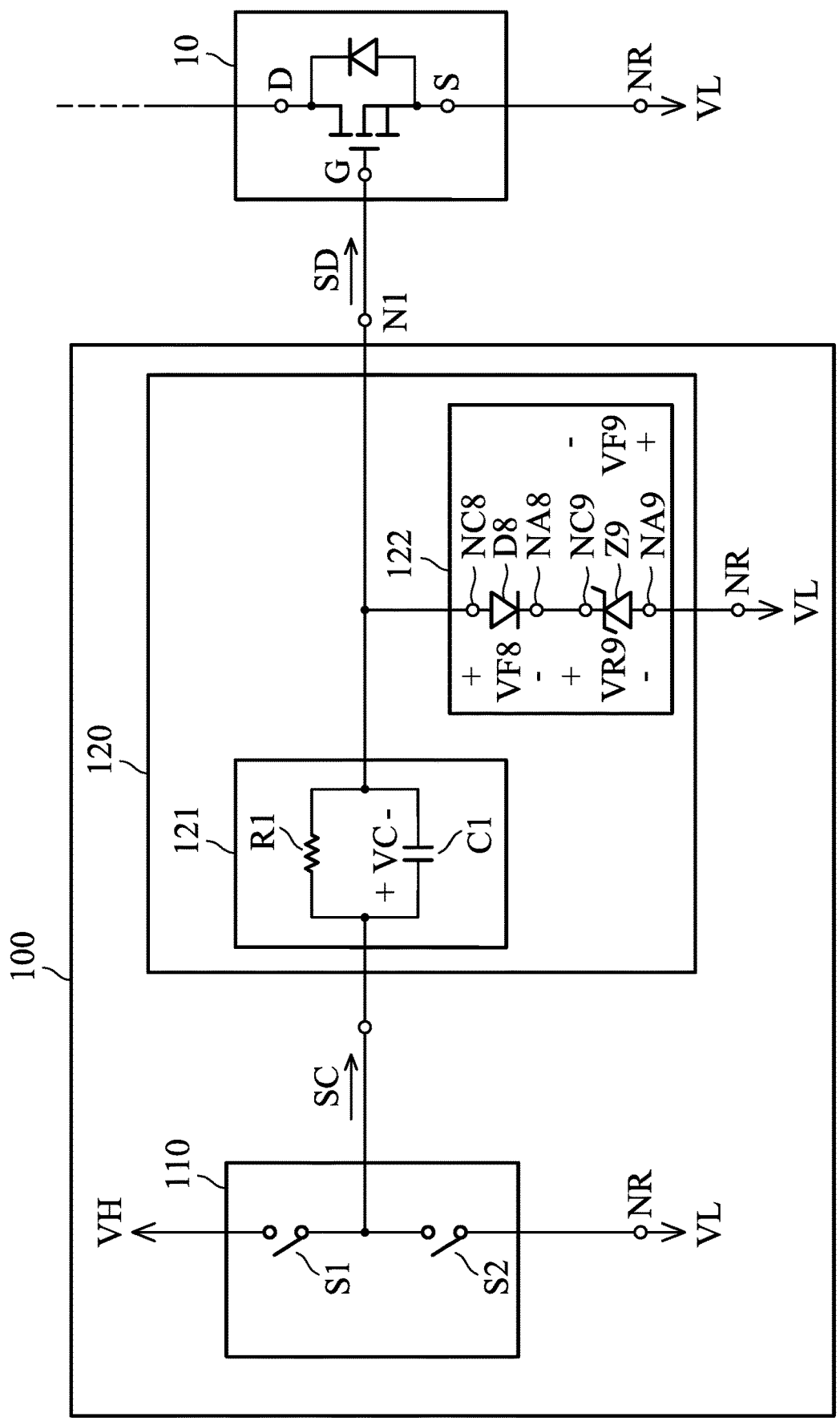
FIG. 8 is a block diagram of a gate driver in accordance with another embodiment of the invention.

FIG. 8 is a block diagram of a gate driver in accordance with another embodiment of the invention. As shown in FIG. 8, the voltage clamp unit 122 includes the eighth diode D8, which has the eighth forward voltage VF8, and the ninth zener diode Z9, which has the ninth forward voltage VF9 and the ninth reverse breakdown voltage VR9. The eighth anode NA8 of the eighth diode D8 is coupled to the ninth cathode NC9 of the ninth zener diode Z9. The eighth cathode NC8 is coupled to the gate terminal G of the switch device 10, and the ninth anode NA9 is coupled to the source of the switch device 10.

According to an embodiment of the invention, when the waveform conversion circuit 120 receives the control signal SC in the high voltage level VH, the driving signal SD is clamped at a clamped voltage equal to the sum of the eighth forward voltage VF8 of the eighth diode D8 and the ninth reverse breakdown voltage VR9 of the ninth zener diode Z9. Therefore, the capacitor voltage VC stored in the first capacitor C1 is equal to the high voltage level VH minus the clamped voltage. According to another embodiment of the invention, when the waveform conversion circuit 120 receives the control signal SC in the low voltage level VL, the driving signal SD is equal to the low voltage level VL minus the capacitor voltage VC, since the eighth diode D8 is open during reverse biasing.

Figure 9:
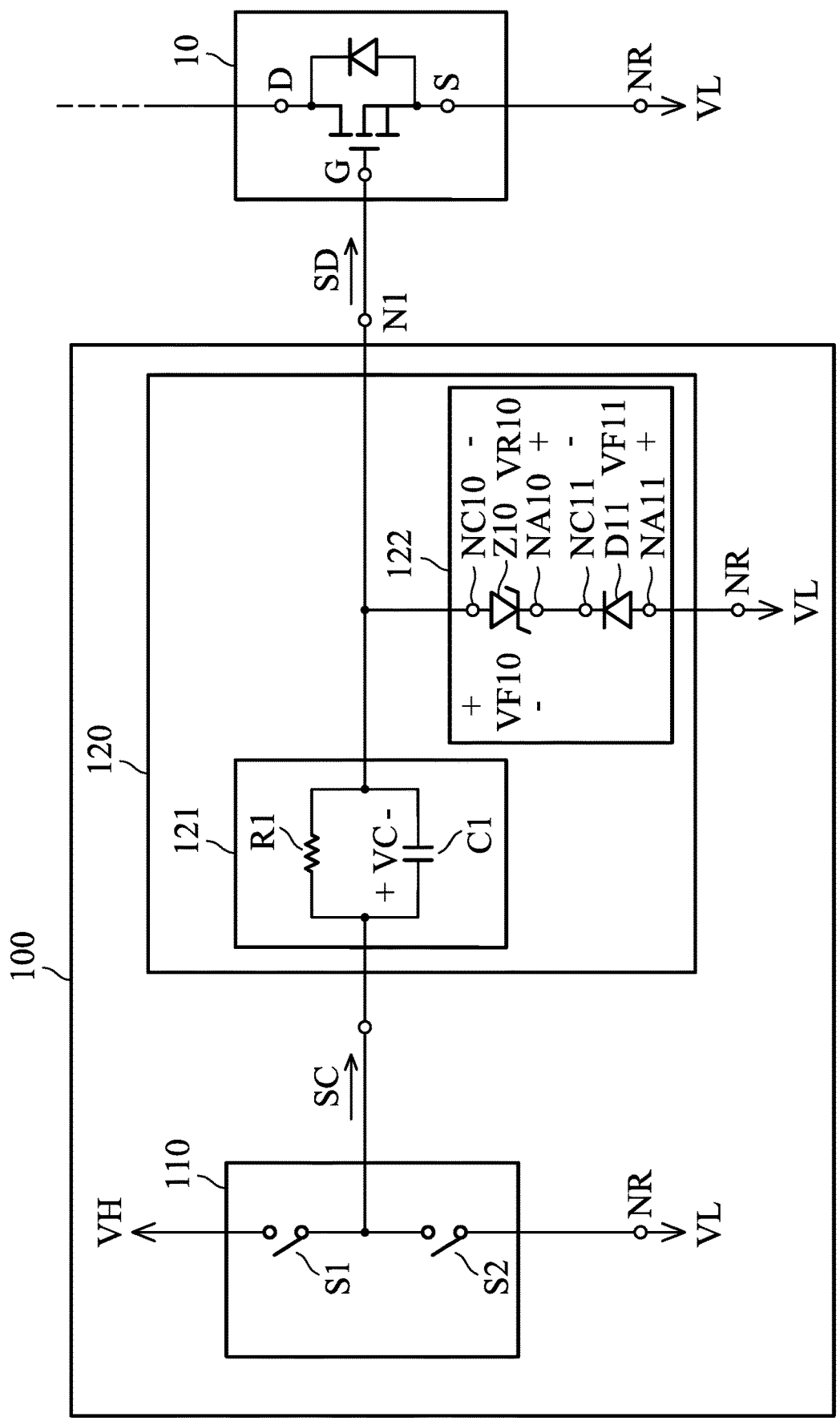
FIG. 9 is a block diagram of a gate driver in accordance with another embodiment of the invention.

FIG. 9 is a block diagram of a gate driver in accordance with another embodiment of the invention. As shown in FIG. 9, the voltage clamp unit 122 includes the tenth zener diode Z10 and the eleventh diode D11. The tenth anode NA10 of the tenth zener diode Z10 is coupled to the eleventh cathode NC11 of the eleventh diode D11. The tenth cathode NC10 is coupled to the gate terminal G of the switch device 10, and the eleventh anode NA11 is coupled to the source of the switch device 10.

According to an embodiment of the invention, when the waveform conversion circuit 120 receives the control signal SC in the high voltage level VH, the driving signal SD is equal to the high voltage level VH, since the eleventh diode D11 is open during forward biasing. According to another embodiment of the invention, when the waveform conversion circuit 120 receives the control signal SC in the low voltage level VL, the driving signal SD is then clamped at the low voltage level VL minus the sum of the tenth reverse breakdown voltage VR10 of the tenth zener diode Z10 and the eleventh forward voltage VF11 of the eleventh diode D11.

Figure 10:
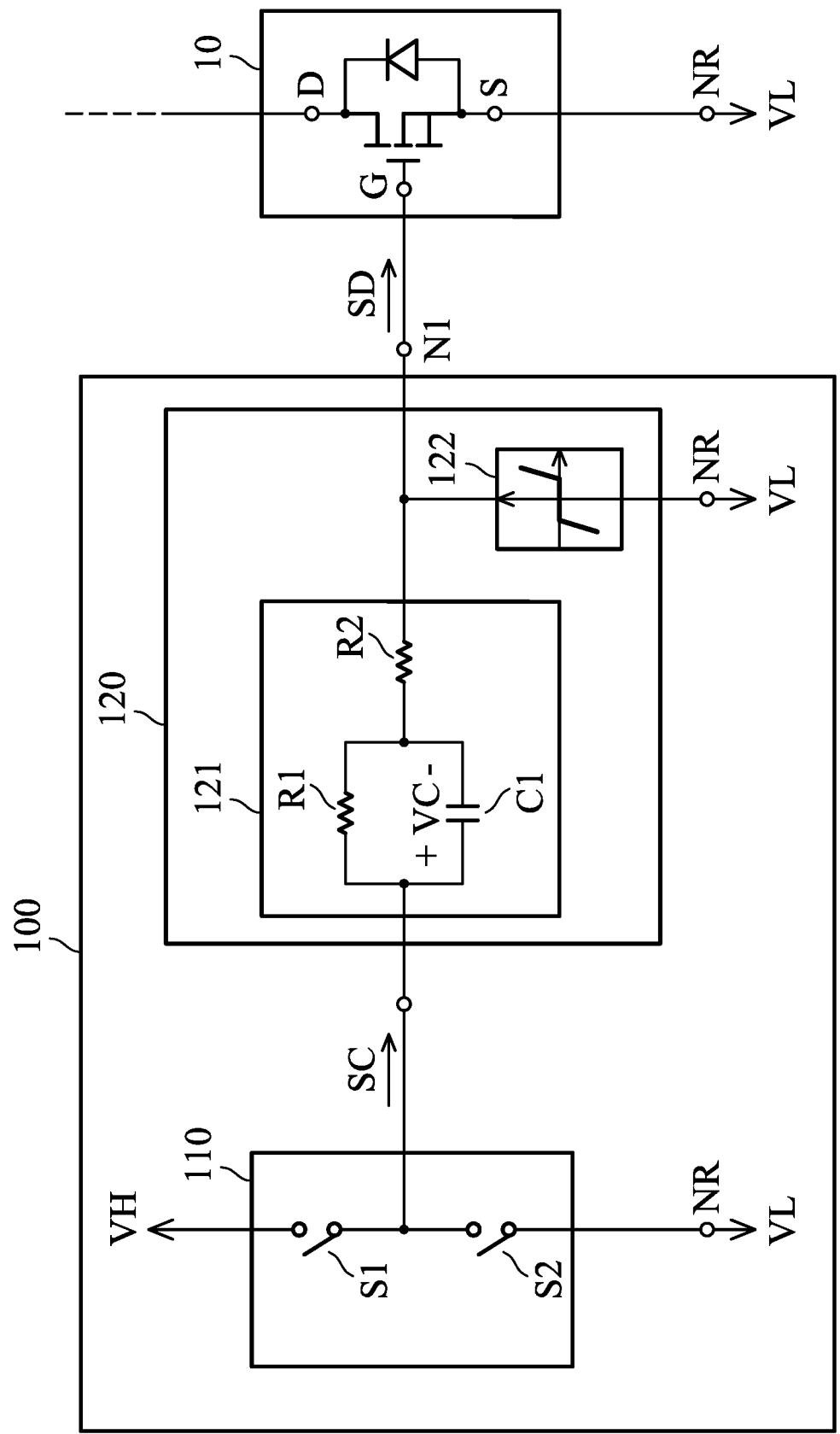
FIG. 10 is a block diagram of a gate driver in accordance with another embodiment of the invention.

FIG. 10 is a block diagram of a gate driver in accordance with another embodiment of the invention. As shown in FIG. 8, the parallel circuit 121 the parallel circuit 121 includes the first resistor R1, the second resistor R2, and the first capacitor C1, in which the second resistor R2 is coupled to the paralleled pair of the first resister R1 and the first capacitor C1 in series.

When the waveform conversion circuit 120 receives the control signal SC in the high voltage level VH, the total resistance of the first resistor R1 and the second resistor R2 is configured to clamp a current flowing from the high voltage level VH to the low voltage level VL through the voltage clamp unit 122. In addition, the second resistor R2 and the first capacitor C1 are configured to determine the overshoot voltage VPO and the undershoot voltage VNO.

Figure 11:
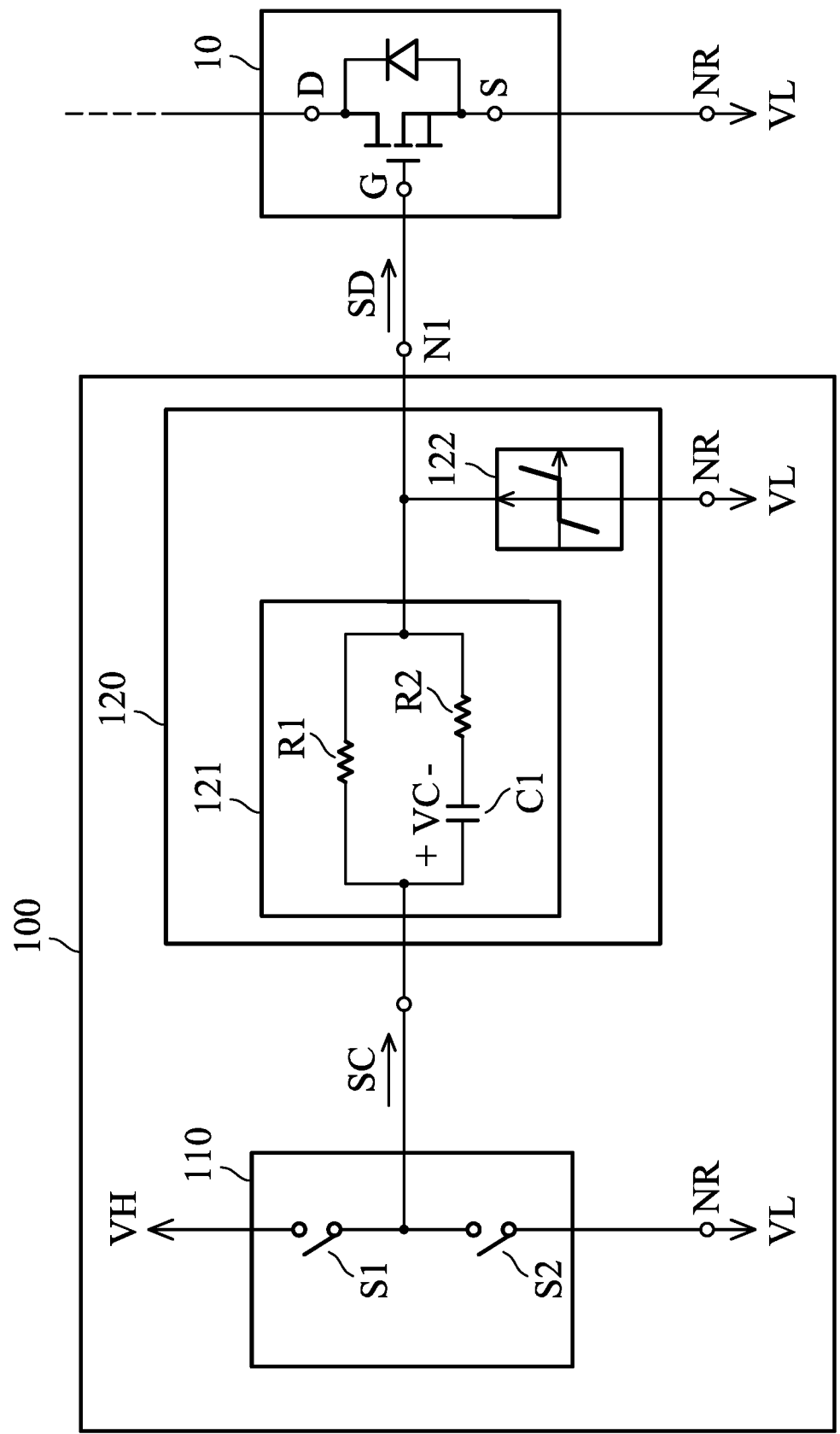
FIG. 11 is a block diagram of a gate driver in accordance with another embodiment of the invention.

FIG. 11 is a block diagram of a gate driver in accordance with another embodiment of the invention. As shown in FIG. 9, the parallel circuit 121 includes the first resistor R1, the second resistor R2, and the first capacitor C1, in which the series pair of the second resistor R2 and the first capacitor C1 is coupled to the first resistor R1 in parallel.

When the waveform conversion circuit 120 receives the control signal SC in the high voltage level VH, the resistance of the first resistor R1 is configured to clamp a current flowing from the high voltage level VH to the low voltage level VL through the voltage clamp unit 122. In addition, the second resistor R2 and the first capacitor C1 are configured to determine the overshoot voltage VPO and the undershoot voltage VNO.

Figure 12:
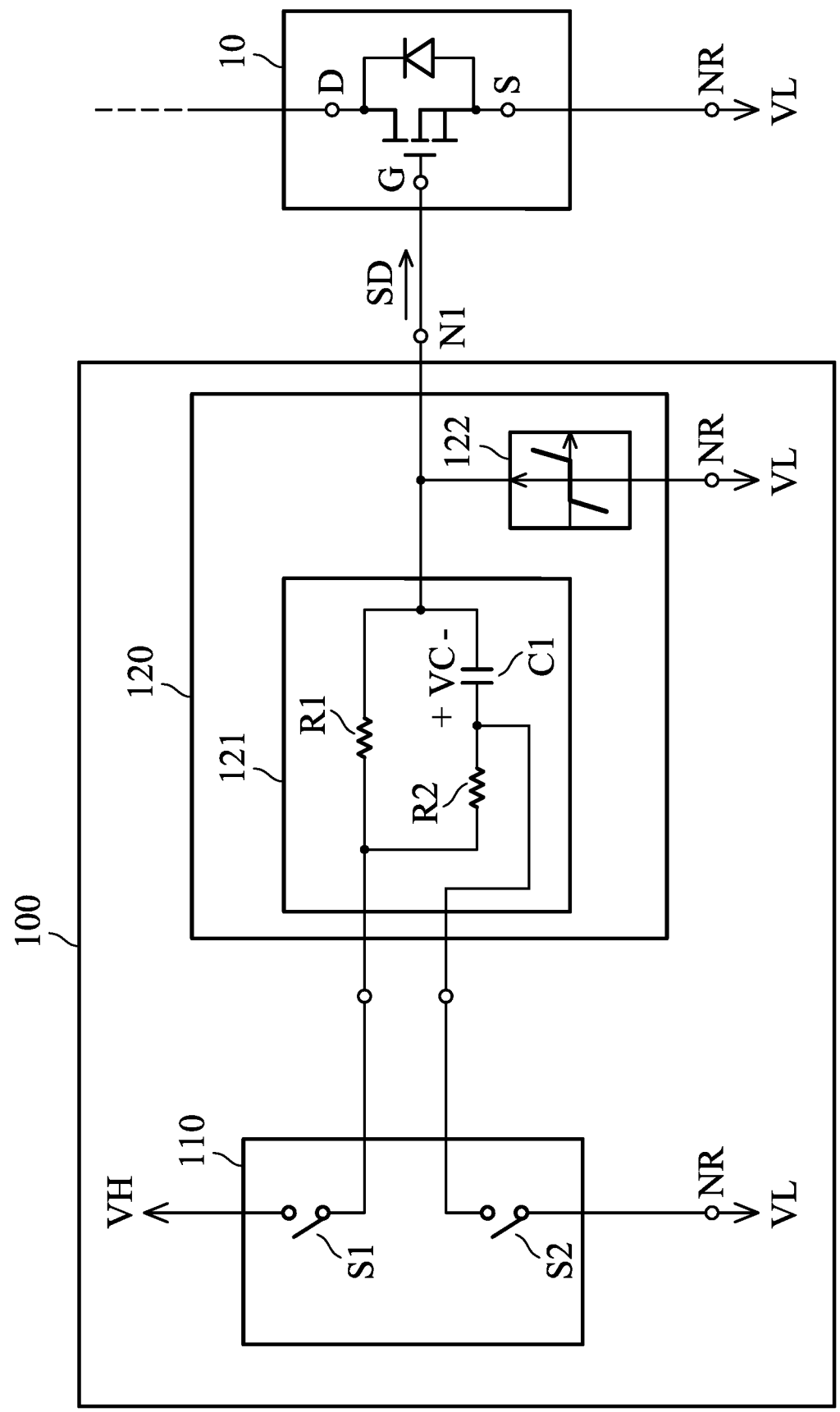
FIG. 12 is a block diagram of a gate driver in accordance with another embodiment of the invention.

FIG. 12 is a block diagram of a gate driver in accordance with another embodiment of the invention. As shown in FIG. 10, the parallel circuit 121 includes the first resistor R1, the second resistor R2, and the first capacitor C1, in which the series pair of the second resistor R2 and the first capacitor C1 is coupled to the first resistor R1 in parallel. The first switch Si of the controller 110 is coupled to an end of the parallel circuit 121, and the second switch S2 is coupled to the middle of the series pair of the second resistor R2 and the first capacitor C1.

When the waveform conversion circuit 120 receives the control signal SC in the high voltage level VH, the resistance of the first resistor R1 is configured to clamp a current flowing from the high voltage level VH to the low voltage level VL through the voltage clamp unit 122. In addition, the overshoot voltage VPO is determined by the second resistor R2 and the first capacitor C1, while the undershoot voltage VNO is determined by the first capacitor C1 and the parasitic resistance along the path from the second switch S2 to the voltage clamp unit 122.

Figure 13:
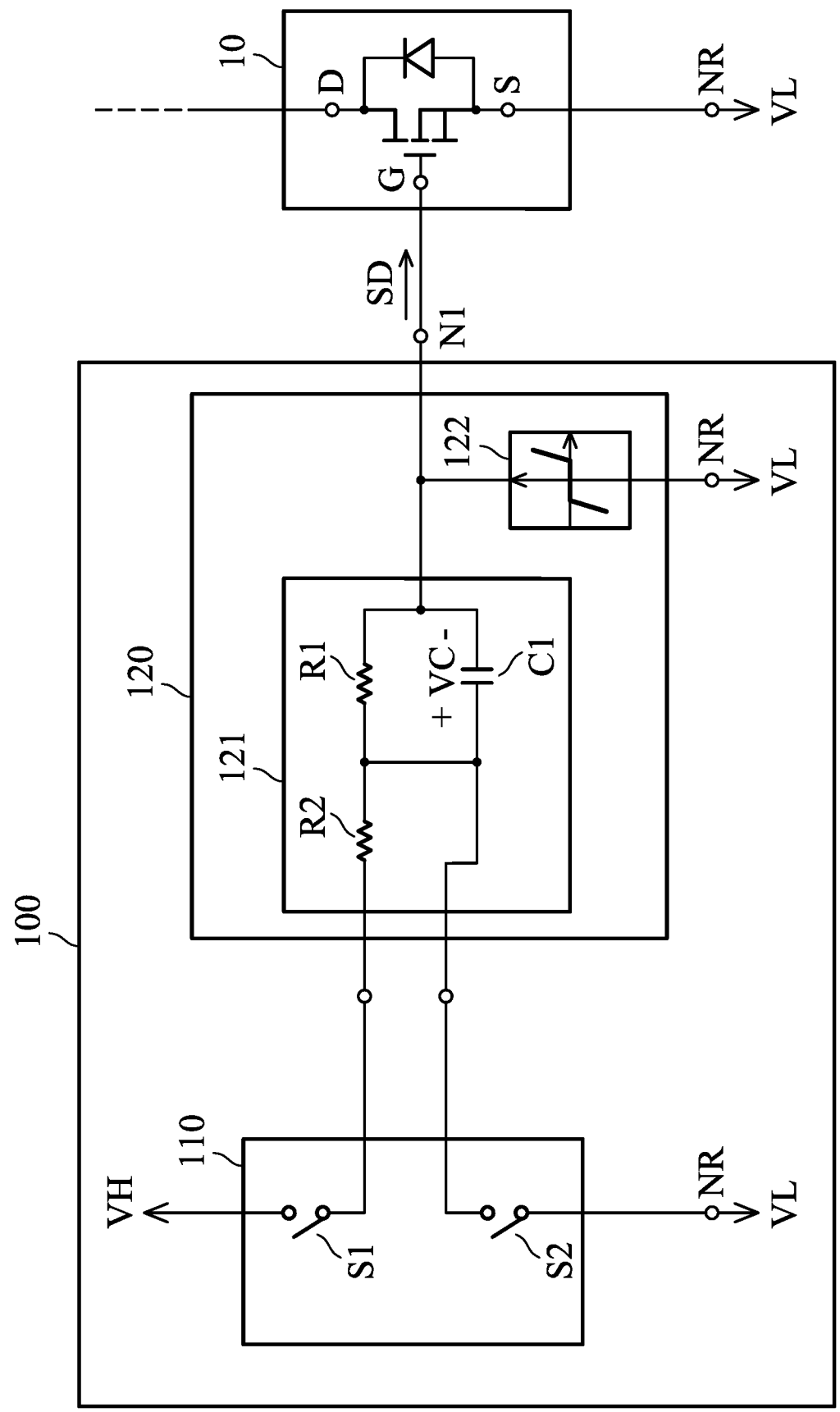
FIG. 13 is a block diagram of a gate driver in accordance with another embodiment of the invention.

FIG. 13 is a block diagram of a gate driver in accordance with another embodiment of the invention. As shown in FIG. 13, the parallel circuit 121 includes the first resistor R1, the second resistor R2, and the first capacitor C1, in which the second resistor R2 is coupled to the paralleled pair of the first resistor R1 and the first capacitor C1 in series. The first switch Si of the controller 110 is coupled to the second resistor R2, and the second switch S2 is coupled to the middle of the second resistor R2 and the paralleled pair of the first resistor R1 and the first capacitor C1.

When the waveform conversion circuit 120 receives the control signal SC in the high voltage level VH, the total resistance of the first resistor R1 and the second resistor R2 is configured to clamp a current flowing from the high voltage level VH to the low voltage level VL through the voltage clamp unit 122. In addition, the overshoot voltage VPO is determined by the second resistor R2 and the first capacitor C1, while the undershoot voltage VNO is determined by the first capacitor C1 and the parasitic resistance along the path from the second switch S2 to the voltage clamp unit 122.

Figure 14:
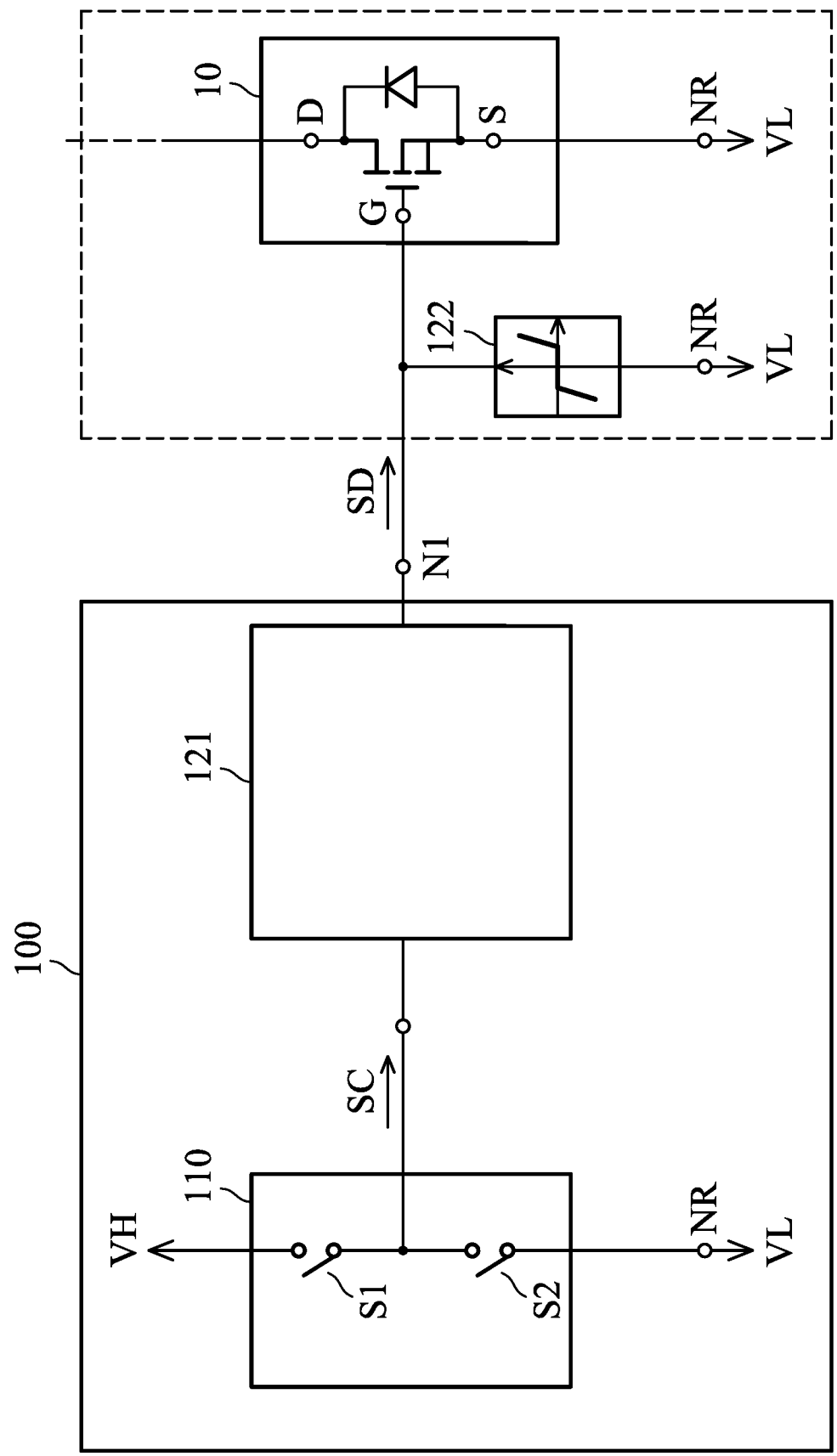
FIG. 14 is a block diagram of a gate driver in accordance with another embodiment of the invention.

FIG. 14 is a block diagram of a gate driver in accordance with another embodiment of the invention. As shown in FIG. 14, the voltage clamp unit 122 and the switch device 10 are packaged together, and the gate driver 100 only includes the controller 110 and the parallel circuit 121.

As illustrated in FIGS. 3-14, several embodiments of the waveform conversion circuit have been described in detail. A controller, which was designed to drive a Si MOSFET, is able to drive a normally-off GaN FET by inserting the waveform conversion circuit illustrated in FIGS. 3-14 between the controller and the switch device without modifying the controller, even though the breakdown voltage of a normally-off GaN FET is less than that of a Si MOSFET.

Figure 15:
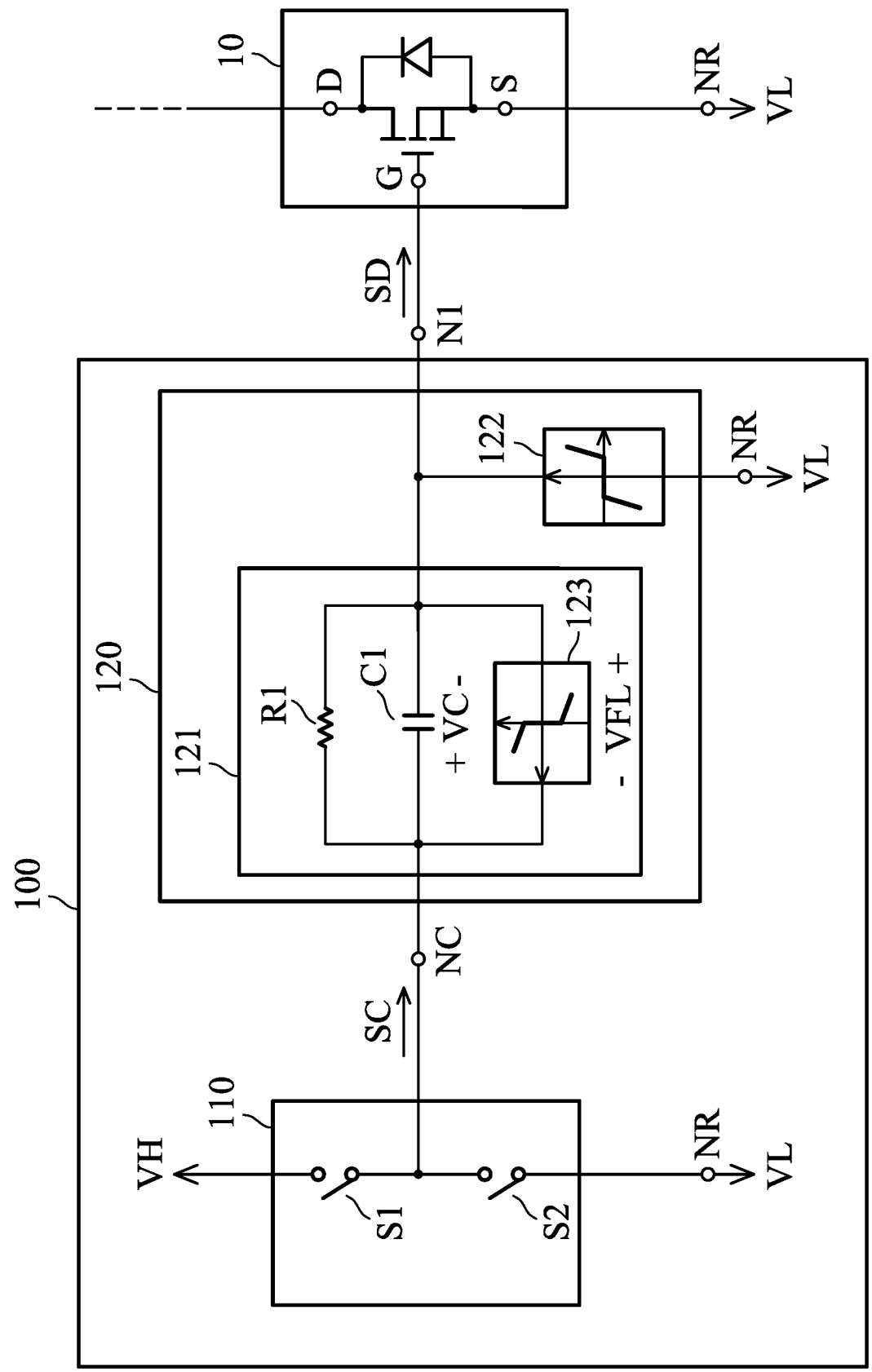
FIG. 15 is a block diagram of a gate driver in accordance with another embodiment of the invention.

FIG. 15 is a block diagram of a gate driver in accordance with another embodiment of the invention. Compared to FIG. 1, the parallel circuit 121 in FIG. 15 includes a first resistor R1, a first capacitor C1 and a unidirectional conducting device 123. As shown in FIG. 15, the first resistor R1, the first capacitor C1, and the unidirectional conducting device 123 are in parallel and coupled between the control node NC and the gate terminal G of the switch device 10.

According to an embodiment of the invention, when the voltage of the gate terminal G of the switch device 10 exceeds the control signal SC by a limit forward voltage VFL of the unidirectional conducting device 123, the unidirectional conducting device 123 is turned ON and discharges the voltage of the gate terminal G of the switch device 10 to the control node NC.

According to another embodiment of the invention, when the voltage of the gate terminal G of the switch device 10 does not exceed the control signal SC, the unidirectional conducting device 123 is OFF. The behavior of the unidirectional conducting device 123 is described further in the following paragraphs.

Figure 16:
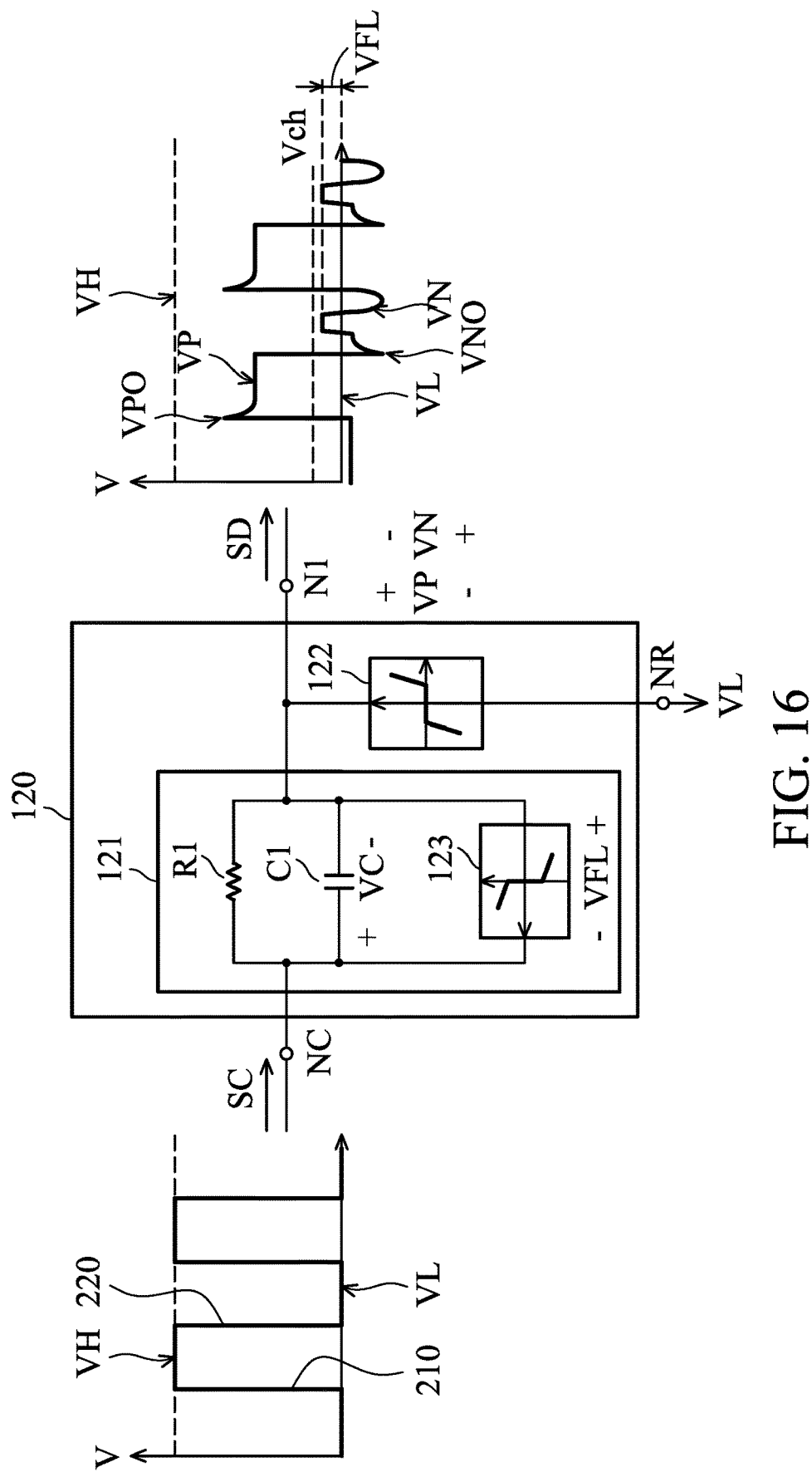
FIG. 16 illustrates the function of the waveform conversion circuit 120 in FIG. 15 in accordance with an embodiment of the invention.

FIG. 16 illustrates the function of the waveform conversion circuit 120 in FIG. 15 in accordance with an embodiment of the invention. As shown in FIG. 16, the control signal SC at the control node NC is illustrated as a square wave herein, which ranges from the high voltage level VH to the low voltage level VL. The overshoot voltage VPO, the second voltage VP, the undershoot voltage VNO, and the first voltage VN are illustrated in FIG. 2, which will not be repeated herein.

When the control signal SC is in the low voltage level VL and the driving signal SD is in the first voltage VN, the driving signal SD may be oscillated so that the driving signal SD exceeds the threshold voltage Vth of the switch device 10. According to an embodiment of the invention, the oscillation on the driving signal SD may be induced by noise coupled from the gate-to-drain capacitance of the switch device 10.

Even though the control signal SC in the low voltage level VL is configured to turn OFF the switch device 10, the oscillation on the driving signal SD in the first voltage VN may turn ON the switch device 10 when the switch 10 is intended to be turned OFF. Therefore, the switch device 10 could be incorrectly turned ON when the oscillation on the driving signal SD is over the threshold voltage Vth of the switch device 10.

The unidirectional conducting device 123 is configured to clamp the oscillation of the driving signal SD in the first voltage VN far from the threshold voltage Vth of the switch device 10. When the oscillation on the driving signal SD in the first voltage VN exceeds the limit forward voltage VFL, the unidirectional conducting device 123 is turned ON to clamp the driving signal SD far from the threshold voltage Vth of the switch device 10.

Figure 17:
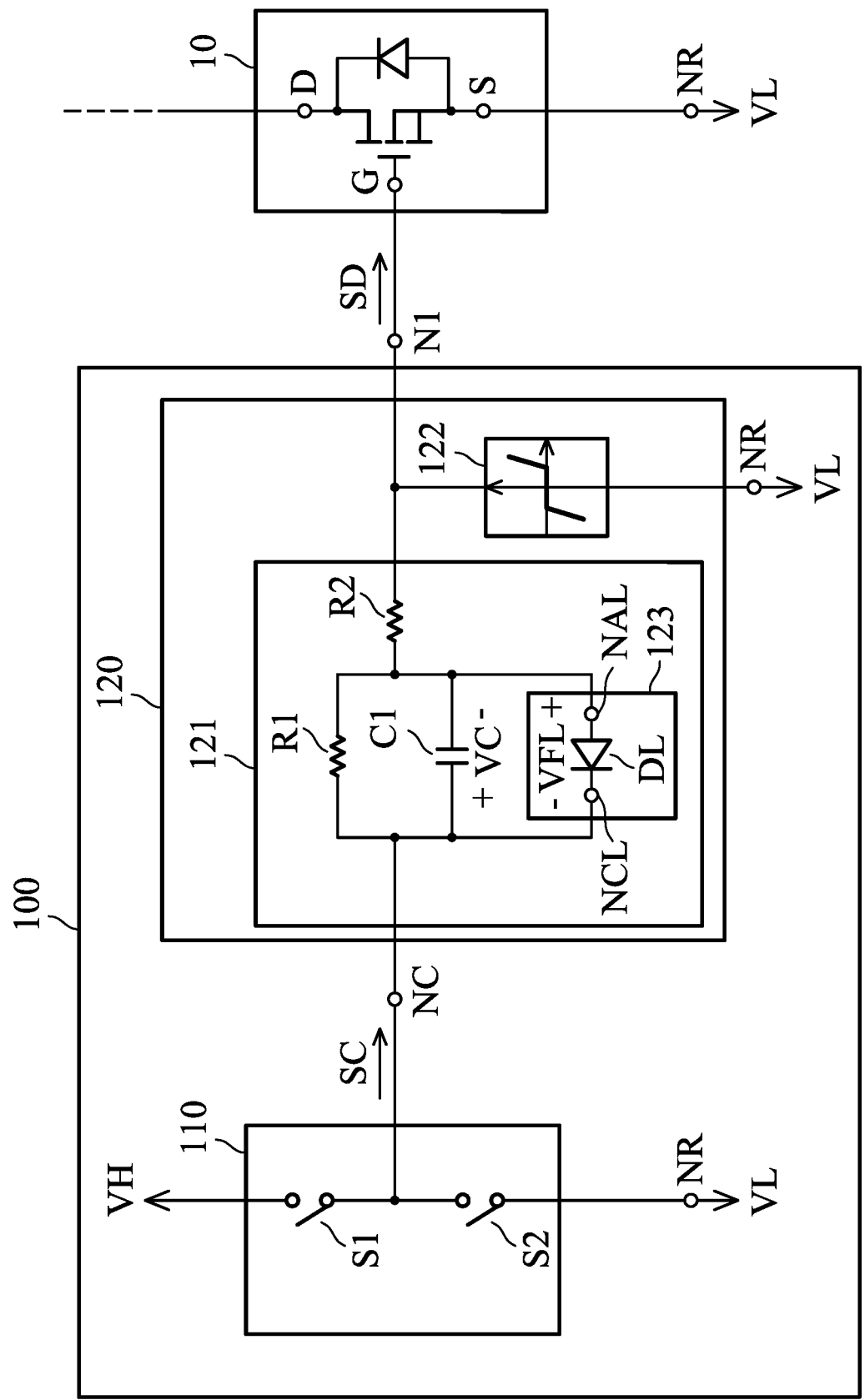
FIG. 17 is a block diagram of a gate driver in accordance with another embodiment of the invention.

FIG. 17 is a block diagram of a gate driver in accordance with another embodiment of the invention. As shown in FIG. 17, the unidirectional conducting device 123 includes a limit diode DL. The limit diode DL includes an anode NAL and a cathode NCL. The anode NAL of the limit diode DL is coupled to the gate terminal G of the switch device 10, and the cathode NCL is coupled to the control node NC. The first voltage VN is clamped by the limit forward voltage VFL of the limit diode DL. According to an embodiment of the invention, the limit forward voltage VFL is lower than the threshold voltage Vth of the switch device 10.

According to another embodiment of the invention, the limit diode DL is a Schottky diode. According to other embodiments of the invention, the limit diode DL can be any kind of diode which has a forward voltage lower than the threshold voltage Vth of the switch device 10.

Figure 18:
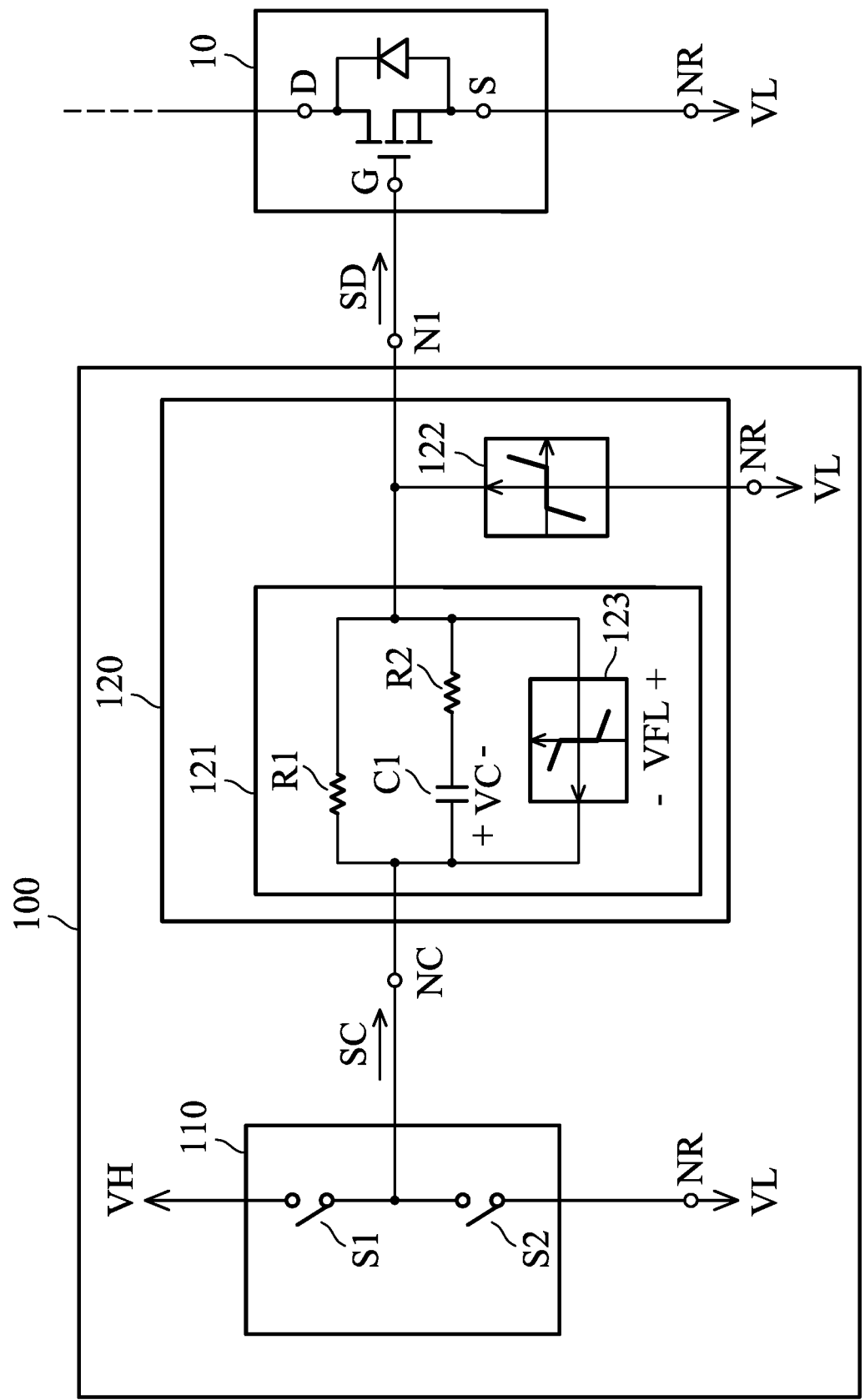
FIG. 18 is a block diagram of a gate driver in accordance with another embodiment of the invention.

FIG. 18 is a block diagram of a gate driver in accordance with another embodiment of the invention. Compared to FIG. 16, the second resistor R2 in FIG. 18 is cascaded with the first capacitor C1. According to an embodiment of the invention, the second resistor R2 and the first capacitor C1 are configured to determine the overshoot voltage VPO and the undershoot voltage VNO as shown in FIG. 16.

Figure 19:
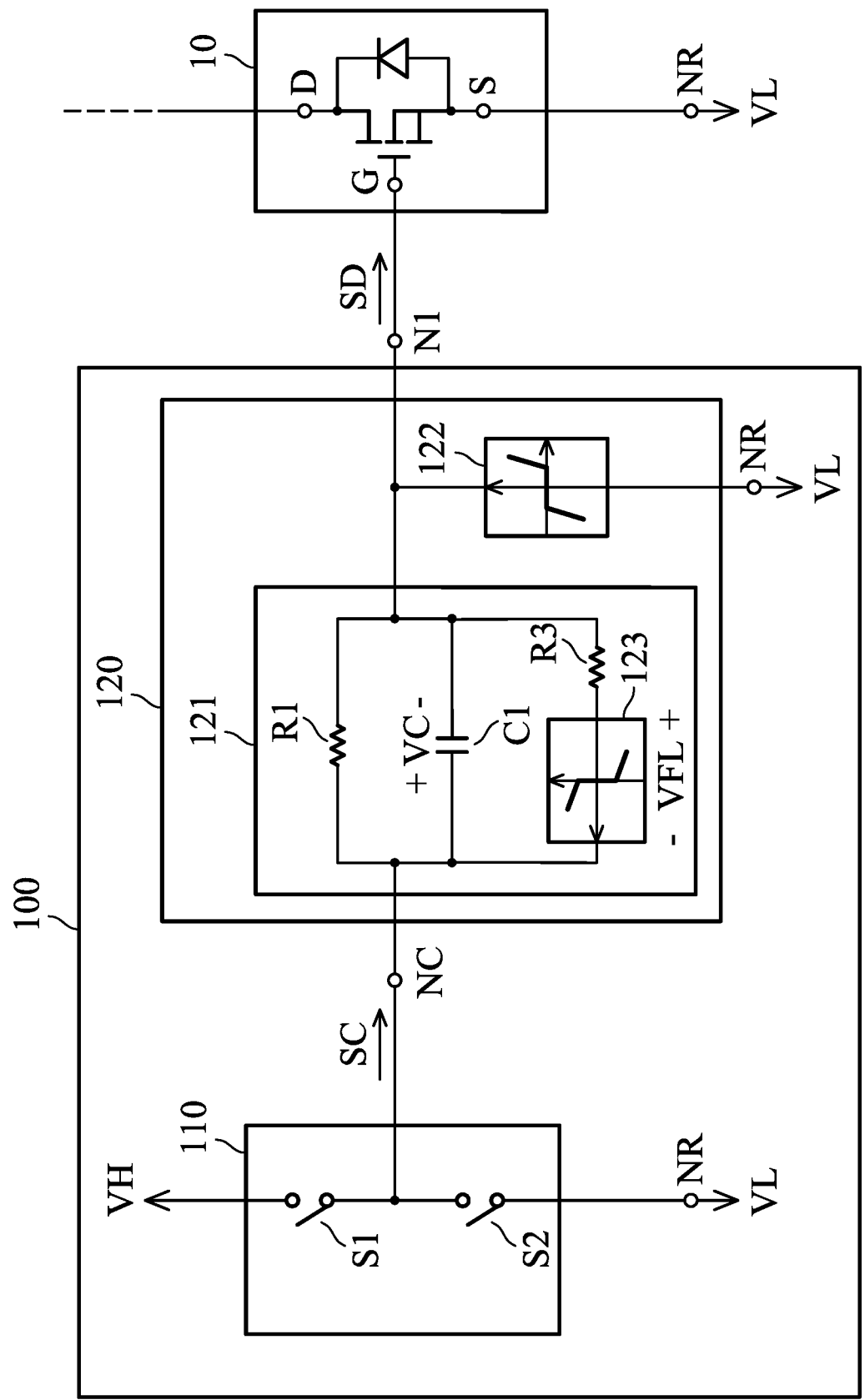
FIG. 19 is a block diagram of a gate driver in accordance with another embodiment of the invention.

FIG. 19 is a block diagram of a gate driver in accordance with another embodiment of the invention. Compared to FIG. 16, the third resistor R3 in FIG. 19 is cascaded with the unidirectional conducting device 123.

According to an embodiment of the invention, the third resistor R3 is configured to lower the speed of the unidirectional conducting device 123 discharging the gate terminal of the switch device 10 so as to protect the gate terminal G of the switch device 10 from undershooting. According to another embodiment of the invention, the second resistor R2 could be also cascaded with the first capacitor C1 in FIG. 19.

As illustrated in FIGS. 15-19, several embodiments of the waveform conversion circuit have been described in further detail. An oscillation on the driving signal SD in the first voltage VN can be effectively inhibited from incorrectly turning ON the switch device 10 by incorporating the unidirectional conducting device 123.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A waveform conversion circuit for converting a control signal of a control node ranging from a high voltage level to a low voltage level of a reference node into a driving signal of a first node, wherein a controller comprises a first switch and a second switch, wherein the first switch is coupled between the high voltage level and the control node and the second switch is coupled between the control node and the low voltage level, wherein the first switch and the second switch are alternately turned ON and OFF to generate pulses on the control signal, wherein a first voltage is converted from the low voltage level of the control signal and a second voltage is converted from the high voltage level of the control signal, wherein the driving signal ranges from the second voltage to the first voltage, the waveform conversion circuit comprising:
    a first resistor, coupled between the control node and the first node;
    a first capacitor, coupled between the control node and the first node;
    a unidirectional conducting device, unidirectionally discharging the first node to the control node; and
    a voltage clamp unit, coupled between the first node and the reference node, wherein the voltage clamp unit is configured to clamp the driving signal.

2. The waveform conversion circuit of claim 1, further comprising:
    a second resistor, coupled between the control node and the first capacitor.

3. The waveform conversion circuit of claim 1, further comprising:
    a third resistor, coupled between the unidirectional conducting device and the control node.

4. The waveform conversion circuit of claim 1, wherein the second voltage is not greater than the high voltage level.

5. The waveform conversion circuit of claim 1, wherein the unidirectional conducting device comprises:
    a limit diode, comprising an anode and a cathode, wherein the anode is coupled to the first node, and the cathode is coupled to the control node, wherein the first voltage is clamped by a limit forward voltage of the limit diode.

6. The waveform conversion circuit of claim 1, wherein the voltage clamp unit comprises:
    a zener diode, comprising an anode and a cathode, wherein the anode is coupled to the reference node, and the cathode is coupled to the first node, wherein the first voltage is determined by a forward voltage of the zener diode, and the second voltage is determined by a reverse breakdown voltage of the zener diode.

7. The waveform conversion circuit of claim wherein the voltage clamp unit comprises:
    a zener diode, comprising an anode and a cathode, wherein the anode is coupled to the first node, and the cathode is coupled to reference node, wherein the first voltage is determined by a reverse breakdown voltage of the zener diode, and the second voltage is determined by a forward voltage of the zener diode.

8. The waveform conversion circuit of claim 1, wherein the voltage clamp unit comprises:
    a diode, comprising an anode and a cathode, wherein the anode is coupled to the first node, and the cathode is coupled to the reference node, wherein the second voltage is determined by a forward voltage of the diode.

9. The waveform conversion circuit of claim 1, wherein the voltage clamp unit comprises:
    a first zener diode, comprising a first anode and a first cathode, wherein the first cathode is coupled to the first node; and
    a second zener diode, comprising a second anode and a second cathode, wherein the second anode is coupled to the first anode, and the second cathode is coupled to the reference node;
    wherein the first voltage is determined by a sum of a reverse breakdown voltage of the second zener diode and a forward voltage of the first zener diode;
    wherein the second voltage is determined by a sum of a reverse breakdown voltage of the first zener diode and a forward voltage of the second zener diode.

10. The waveform conversion circuit of claim 1, wherein the voltage clamp unit comprises:
    a first diode, comprising a first anode and a first cathode, wherein the first cathode is coupled to the first node and the first anode is coupled to the reference node; and
    a second diode, comprising a second anode and a second cathode, wherein the second anode is coupled to the first node and the second cathode is coupled to the reference node;
    wherein the first voltage is determined by a forward voltage of the first diode and the second voltage is determined by a forward voltage of the second diode.

11. The waveform conversion circuit of claim 1, wherein the voltage clamp unit comprises:
    a first diode, comprising a first anode and a first cathode, wherein the first anode is coupled to the first node; and
    a zener diode, comprising a zener anode and a zener cathode, wherein the zener anode is coupled to the reference node, and the zener cathode is coupled to the first cathode;
    wherein the first voltage is determined by the low voltage level minus the capacitor voltage stored in the first capacitor, wherein the capacitor voltage is equal to the high voltage level minus a sum of a reverse breakdown voltage of the zener diode and a forward voltage of the first diode;
    wherein the second voltage is determined by the sum of the reverse breakdown voltage of the zener diode and the forward voltage of the first diode.

12. The waveform conversion circuit of claim 1, wherein the voltage clamp unit comprises:
    a zener diode, comprising a zener anode and a zener cathode, wherein the zener anode is coupled to the first node; and
    a first diode, comprising a first anode and a first cathode, wherein the first anode is coupled to the reference node, and the first cathode is coupled to the zener cathode;
    wherein the first voltage is determined by a sum of a reverse breakdown voltage of the zener diode and a forward voltage of the first diode;
    wherein the second voltage is equal to the high voltage level.

13. A gate-driving circuit for turning a switch device on and off by applying a driving signal to a gate terminal of the switch device, the switch device having the gate terminal, a drain terminal, and a source terminal coupled to a reference node, the gate-driving circuit comprising:
    a controller, supplied by a high voltage level and a low voltage level to generate a control signal at a control node ranging from the high voltage level to the low voltage level of the reference node, wherein the controller comprises a first switch and a second switch, wherein the first switch is coupled between the high voltage level and the control node and the second switch is coupled between the control node and the low voltage level, wherein the first switch and the second switch are alternately turned ON and OFF to generate pulses on the control signal; and a waveform conversion circuit, converting the control signal to the driving signal ranging from a second voltage to a first voltage, wherein the first voltage is converted from the low voltage level of the control signal, and the second voltage is converted from the high voltage level of the control signal, wherein the waveform conversion circuit comprises:

a first resistor, coupled between the control node and the gate terminal of the switch device;

a first capacitor, coupled between the control node and the gate terminal of the switch device;

a unidirectional conducting device, unidirectionally discharging the gate terminal of the switch device to the control node; and a voltage clamp unit, coupled between the gate terminal and the source terminal of the switch device and configured to clamp the driving signal.

14. The gate-driving circuit of claim 13, wherein the waveform conversion circuit further comprises:

a second resistor, coupled between the control node and the first capacitor.

15. The gate-driving circuit of claim 13, wherein the waveform conversion circuit further comprises:

a third resistor, coupled between the unidirectional conducting device and the control node.

16. The gate-driving circuit of claim 13, wherein the second voltage is not greater than the high voltage level.

17. The gate-driving circuit of claim 13, wherein the unidirectional conducting device comprises:

a limit diode, comprising an anode and a cathode, wherein the anode is coupled to the gate terminal of the switch device, and the cathode is coupled to the control node, wherein the first voltage is clamped by a limit forward voltage of the limit diode.

18. The gate-driving circuit of claim 13, wherein the voltage clamp unit comprises:

a zener diode, comprising an anode and a cathode, wherein the anode is coupled to the source terminal of the switch device, and the cathode is coupled to the gate terminal of the switch device, wherein the first voltage is determined by a forward voltage of the zener diode, and the second voltage is determined by a reverse breakdown voltage of the zener diode.

19. The gate-driving circuit of claim 13, wherein the voltage clamp unit comprises:

a zener diode, comprising an anode and a cathode, wherein the anode is coupled to the gate terminal of the switch device, and the cathode is coupled to the source terminal of the switch device, wherein the first voltage is determined by a reverse breakdown voltage of the zener diode, and the second voltage is determined by a forward voltage of the zener diode.

20. The gate-driving circuit of claim 13, wherein the voltage clamp unit comprises:

a diode, comprising an anode and a cathode, wherein the anode is coupled to the gate terminal of the switch device, and the cathode is coupled to the source terminal of the switch device, wherein the second voltage is determined by a forward voltage of the diode.

21. The gate-driving circuit of claim 13, wherein the voltage clamp unit comprises:

a first zener diode, comprising a first anode and a first cathode, wherein the first cathode is coupled to the gate terminal of the switch device; and a second zener diode, comprising a second anode and a second cathode, wherein the second anode is coupled to the first anode, and the second cathode is coupled to the source terminal of the switch device;

wherein the first voltage is determined by a sum of a reverse breakdown voltage of the second zener diode and a forward voltage of the first zener diode;

wherein the second voltage is determined by a sum of a reverse breakdown voltage of the first zener diode and a forward voltage of the second zener diode.

22. The gate-driving circuit of claim 13, wherein the voltage clamp unit comprises:

a first diode, comprising a first anode and a first cathode, wherein the first cathode is coupled to the gate terminal of the switch device and the first anode is coupled to the source terminal of the switch device; and a second diode, comprising a second anode and a second cathode, wherein the second anode is coupled to the gate terminal of the switch device, and the second cathode is coupled to the source terminal of the switch device;

wherein the first voltage is determined by a forward voltage of the first diode and the second voltage is determined by a forward voltage of the second diode.

23. The gate-driving circuit of claim 13, wherein the voltage clamp unit comprises:

a first diode, comprising a first anode and a first cathode, wherein the first anode is coupled to the gate terminal of the switch device; and a zener diode, comprising a zener anode and a zener cathode, wherein the zener anode is coupled to the source terminal of the switch device, and the zener cathode is coupled to the first cathode;

wherein the first voltage is determined by the low voltage level minus the capacitor voltage stored in the first capacitor, wherein the capacitor voltage is equal to the high voltage level minus a sum of the reverse breakdown voltage of the zener diode and the forward voltage of the first diode;

wherein the second voltage is determined by the sum of the reverse breakdown voltage of the zener node and the forward voltage of the first diode.

24. The gate-driving circuit of claim 13, wherein the voltage clamp unit comprises:

a zener diode, comprising a zener anode and a zener cathode, wherein the zener anode is coupled to the gate terminal of the switch device; and a first diode, comprising a first anode and a first cathode, wherein the first anode is coupled to the source terminal of the switch device, and the first cathode is coupled to the zener cathode;

wherein the first voltage is determined by a sum of a reverse breakdown voltage of the zener diode and a forward voltage of the first diode;

wherein the second voltage is equal to the high voltage level.

25. The gate-driving circuit of claim 13, wherein the voltage clamp unit and the switch device are packaged together.

* * * * *